(12) United States Patent
Hattori et al.

(10) Patent No.: US 6,798,593 B2
(45) Date of Patent: Sep. 28, 2004

(54) METHOD AND APPARATUS FOR REPRODUCING DATA AND METHOD AND APPARATUS FOR RECORDING AND/OR REPRODUCING DATA

(75) Inventors: Masayuki Hattori, Kanagawa (JP); Jun Murayama, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 09/814,548

(22) Filed: Mar. 22, 2001

(65) Prior Publication Data

US 2001/0050889 A1 Dec. 13, 2001

(30) Foreign Application Priority Data

Mar. 23, 2000 (JP) .......................................... 2000-087128

(51) Int. Cl.$^7$ ............................................... G11B 5/09
(52) U.S. Cl. ........................................................ 360/53
(58) Field of Search ............................... 360/53, 31, 40, 360/46, 39, 48; 714/795, 755; 371/37.1; 341/59, 15, 50

(56) References Cited

U.S. PATENT DOCUMENTS

| | | | | |
|---|---|---|---|---|
| 5,109,385 A | * | 4/1992 | Karp et al. ............... | 714/775 |
| 5,689,532 A | * | 11/1997 | Fitzpatrick .................. | 375/341 |
| 5,757,822 A | * | 5/1998 | Fisher et al. ............... | 714/755 |
| 5,892,884 A | * | 4/1999 | Sugiyama et al. ............ | 386/96 |
| 6,201,485 B1 | * | 3/2001 | McEwen et al. ............ | 341/59 |
| 6,424,477 B1 | * | 7/2002 | Saito et al. .................. | 360/48 |

FOREIGN PATENT DOCUMENTS

| | | | | |
|---|---|---|---|---|
| EP | 0 802 634 | | 10/1997 | |
| EP | 0998087 | * | 5/2000 | ............ H04L/27/34 |

OTHER PUBLICATIONS

Benedetto S et al: "Serial Concatenation of Interleaved Codes: Performance Analysis, Design, and Iterative Decoding" TMO Progress Report, Aug. 15, 1996, XP002163216 Retrieved from the Internet: <URL:http://tmo.jpl.nasa.gov/tmo.progress_report/> 'retrieved on Mar. 19, 2001!* figures 4, 14 *.

Souvignier T et al: "Turbo Decoding for PR4: Parallel Versus Serial Concatenation" ICC '99. 1999 IEEE International Conference on Communications. Conference Record. Vancouver, CA, Jun. 6–10, 1999, IEEE International Conference on Communications, New York, NY: IEEE, US, vol. 3, Jun. 6, 1999, pp. 1638–1642, XP002170541 ISBN: 0–7803–5285–8 * the whole document *.

(List continued on next page.)

*Primary Examiner*—David Hudspeth
*Assistant Examiner*—Glenda P. Rodriguez
(74) *Attorney, Agent, or Firm*—Frommer Lawrence & Haug LLP; William S. Frommer; Bruno Polito

(57) ABSTRACT

A magnetic recording and/or reproducing apparatus which achieves high performance encoding and high efficiency decoding to lower the decoding error rate. A magnetic recording and/or reproducing apparatus 50 includes, in its recording system, an error correction coder 51 for error correction coding input data and an interleaver 52 for scrambling the sequence of data supplied from the error correction coder 51. The magnetic recording and/or reproducing apparatus 50 also includes, in its reproducing system, s modulation and error correction turbo decoder 64 provided with a deinterleaver for scrambling and re-arraying the sequence of the input data such as to restore the sequence of input data re-arrayed by the interleaver 52 to an original bit sequence, an error correction soft decoder for decoding data supplied from the deinterleaver and with a second interleaver for scrambling and re-arraying the sequence of data given as a difference between data output from the error correction soft decoder and data output from the deinterleaver.

64 Claims, 10 Drawing Sheets

OTHER PUBLICATIONS

Petersen J: "Implementierungsaspekte Zur Symbol–by–Symbol Map–Decodierung Von Faltungscodes" Codierung Fur Quelle, Kanal Und Ubertragung. Vortrage Der ITG–Fachtagung, Munchen, Oct. 26–28, 1994, ITG Fachberichte, Berlin, VDE Verlag DE, vol. NR. 130, 1994, pp. 41–48, XP000503776 ISBN: 3–8007–2036–1 * paragraph '0002! *.

Lynch R T: "Channels and Codes for Magnetooptical Recording" IEEE Journal on Selected Areas in Communications, IEEE Inc. New York, US, vol. 10, No. 1, 1992, pp. 57–72, XP000462065 ISSN: 0733–8716 * paragraph 'OV.D! *.

Fan J L et al: "Constrained Coding Techniques for Soft Iterative Decoders" 1999 IEEE Global Telecommunications Conference. GLOBECOM'99. Seamless Interconnection for Universal Services. Rio De Janeiro, Brazil, Dec. 5–9, 1999, IEEE Global Telecommunications Conference, New York, NY: IEEE, US, vol. IB, Dec. 5, 1999, pp. 723–727, XP002170347, ISBN: 0–7803–5797–3.

Battail G: "Polynomial Description of Linear Block Codes and Its Applications to Soft–Input, Soft Output Decoding" Annales Des Telecommunications—Annals of Telecommunications, Presses Polytechniques Et Universitaires Romandes, Lausanne, CH, vol. 54, No. 3/4, Mar. 1999, pp. 148–165, XP000834637, ISSN: 0003–4347.

Cideciyan R D et al: "A PRML System for Digital Magnetic Recording:" IEEE Journal on Selected Areas in Communications, IEEE Inc. New York, US, vol. 10, No. 1, 1992, pp. 38–56, XP000457625 ISSN: 0733–8716.

Benedetto S et al: "Soft–Output Decoding Algorithms for Continuous Decoding of Parallelconcatenated Convolutional Codes" 1996 IEEE International Conference on Communications (ICC). Converging Technologies for Tomorrow's Applications. Dallas, Jun 23–27, 1996, IEEE International Conference on Communications (ICC), New York, IEEE, US, vol. 1, Jun. 23, 1996, pp. 112–117, XP000625652, ISBN: 0–7803–3251–2.

* cited by examiner

METHOD AND APPARATUS FOR REPRODUCING DATA AND METHOD AND APPARATUS FOR RECORDING AND/OR REPRODUCING DATA

BACKGROUND OF THE INVENTION

1. Field of the Invention

This invention relates to a method and apparatus for recording data on a recording medium, a method and apparatus for reproducing data recorded on a recording medium and a method and apparatus for recording and/or reproducing data for a recording medium.

2. Description of Related Art

As a recording medium for recording digital data, there are known a wide variety of recording mediums of the magnetic, optical or photomagnetic system, such as a hard disc, a so-called DVCR (digital video cassette recorder) or a so-called CD (Compact Disc), DVD (digital versatile disc) and a so-called MO (magneto-optical disc).

For recording signals on these recording mediums, physical processing needs to be performed on the recording mediums, such as by controlling the direction of magnetization by a write head for a recording medium of the magnetic recording system, or by forming pits of lengths corresponding to signals by a stamper for a recording medium of the optical recording system. In this case, in order to permit the normal operation of amplitude control of readout signals or clock reproduction on the reproducing side reading out the signals recorded on the recording medium, the signal recording side for recording signals on a recording medium routinely uses a system of modulation encoding the signal in a pre-set fashion to record the resulting modulation-coded signal.

A modulation-coder, performing this modulation coding, routinely is fed with binary signals exempt from various limitations, and outputs binary signals free of various limitations. These limitations on the signals include DC free limitations which state that the numbers of "0"s and "1"s be equalized over a sufficient long length of the concatenations of "0"s and "1"s, and the (d, k) limitations which state that the minimum and maximum numbers of consecutive "0"s and "1"s in a code be d and k, respectively. FIG. 1 shows an input/output example in a modulation coder outputting a code satisfying the (d, k)=(2, 7) limitations. Specifically, a modulation coder 150, outputting a code satisfying the (d, k)=(2, 7) limitation, is shown in FIG. 1, by way of concrete explanation of the concept of the (d, k) limitations. That is, if fed with an input signal, free of the limitation, the modulation coder 150, outputting a code satisfying the (d, k)=(2, 7) limitation, modulation-encodes the input signal to generate and output a signal in which the minimum and maximum numbers of consecutive "0"s are 2 and 7, respectively.

The above example indicates that, in converting a bit string free of limitations is converted into another bit string subjected to limitations, the total number of the output bits is larger than that of the input bits. If the total number of input bits is K and the total number of output bits is N, the ratio K/N is represented as a code rate R. This code rate R serves as an index indicating the efficiency of the modulation coding. If two or more modulation coders, generating output signals satisfying the same limitations, are compared to one another, a modulation coder having the high code rate R is able to encode more input bits for a given number of output bits than one having the low code rate R. Stated differently, a modulation coder having a high code rate R is able to record more information on a pre-set recording medium than one having a low code rate R.

The modulation coding may be classified into a block coding system in which input bits are divided into plural blocks of pre-set lengths and output bits generated are divided into plural blocks of pre-set lengths corresponding to the blocks of the input bits, and a variable length coding system, in which encoding units of input bits and output bits associated with the input bits are variable. For example, the so-called 8/9 code or the 16/17 code, routinely used for modulation coding, belong to the block coding system, whilst the so-called (1, 7) RLL code or the (2, 7) RLL code belong to the variable length encoding system.

For example, in a block modulation encoding system, fed with two bits as input bits, and generating three output bits satisfying the (d, k)=(0, 2) limitations, a modulation coder has a conversion table as Table 1:

TABLE 1

Example of Conversion Table

| input bits | output bits |
|---|---|
| 00 | 011 |
| 01 | 101 |
| 10 | 111 |
| 11 | 110 | stored in e.g., a memory, not shown. The modulation coder references this conversion table and finds, for each 2-bit input, an associated 3-bit output, with the output bits being issued as outputs sequentially.

On the other hand, a modulation decoder for modulating-decoding the modulation-coded signals has a back-conversion table, as Table 2:

TABLE 2

Example of Back-Conversion Table

| input bit | decoded bits |
|---|---|
| 000 | 01 |
| 001 | 00 |
| 010 | 10 |
| 011 | 00 |
| 100 | 11 |
| 101 | 01 |
| 110 | 11 |
| 111 | 10 | corresponding to the conversion table of Table 1, stored in e.g., a memory, not shown. The modulation decoder references this back-conversion table to find and sequentially output 2-bit decoded bits, associated with the 3-bit input bits.

FIG. 2 shows a typical modulation decoder 160 having at least a ROM (read-only memory) 161. The modulation decoder 160 is fed with an input address signal D161 to output the contents stored in an address of the ROM 161 corresponding to this input address signal D161 as a demodulated decoded signal D162. In actuality, if the input bits are back-converted into decoded bits in accordance with the back-conversion table shown in Table 2, the contents of the decoded bits are stored in addresses of a ROM 161 of the modulation decoder 160, corresponding to the input bits in Table 2. The decoded bits, stored in these addresses, are read out by way of performing the back-conversion.

FIG. 3 shows a typical modulation decoder 170 at least having a combination circuit 171. The modulation decoder 170 is fed with an input signal D171 and executes logical operations on the input signal D171 by the combination circuit 171 to generate a modulated decoded signal D172. In actuality, if, in performing back conversion from the input bits to the decoded bits in accordance with the back-conversion table of Table 2, the three-bit input signal D171 is represented as ($a_0$, $a_1$, $a_2$) and a two-bit modulated decoded signal D172 is represented as ($b_0$, $b_1$), the modulation decoder 170 generates the output bits ($b_0$, $b_1$) by the combination circuit 171 corresponding to the following logical equations (1):

$$b_0 = (a_1 \& a_2) | (a_0 \& !a_1 \& !a_2) | (!a_0 \& a_1 \& !a_2)$$
$$b_1 = (a_0 \& !a_1) | (!a_0 \& !a_1 \& !a_2) | (a_0 \& a_1 \& !a_2) \quad (1)$$

where |, & and ! indicate the logical sum, logical product and logical negation, respectively.

If the modulation coder and the modulation decoder are applied to a magnetic recording and/or reproducing apparatus for recording and/or reproducing data on or from a recording medium in accordance with the magnetic recording system, the recording and/or reproducing apparatus is configured as shown in FIG. 4.

That is, a magnetic recording and/or reproducing apparatus 200, shown in FIG. 4, includes, as a recording system for recording data on a recording medium 250, an error correction encoder 201 for error correction encoding input data, a modulation encoder 202 for modulation encoding the input data, a precoder 203 for filtering input data for compensating its channel characteristics, a write current driver 204 for converting respective bits of the input data into write current values, and a write head 205 for recording data on the recording medium 250. The magnetic recording and/or reproducing apparatus 200 also includes, as are producing system for reproducing data recorded on the recording medium 250, a readout head 206 for reading out data recording on the recording medium 250, an equalizer 207 for equalizing the input data, a gain adjustment circuit 208 for adjusting the gain of the input data, an analog/digital converter (A/D converter) 209 for converting analog data into digital data, a timing generating circuit 210 for generating clocks, a gain adjustment control circuit 211 for controlling the gain adjustment circuit 208, a viterbi decoder 212 for viterbi-decoding the input data, a modulation decoder 213 for modulation decoding the input data and an error correction decoder 214 for error correction decoding the input data.

In recording data on the recording medium 250, the magnetic recording and/or reproducing apparatus 200 performs the following operations:

When fed with the input data D201, the magnetic recording and/or reproducing apparatus 200 applies error correction coding to the input data D201, by the error correction encoder 201, to generate error correction encoded data D202.

The magnetic recording and/or reproducing apparatus 200 modulation encodes the error correction encoded data D202 from the error correction encoder 201, by the modulation encoder 202, to generate modulation-encoded data D203, which is a string of bits subjected to limitations.

The magnetic recording and/or reproducing apparatus 200 performs filtering on the modulation-encoded data D203, supplied from the modulation encoder 202, by the precoder 203, in such a manner as to compensate for channel characteristics as from the writing of data on the recording medium 250 up to outputting thereof at the equalizer 207 in the reproducing system, to generate a precode signal D204.

For example, if the channel has 1-D characteristics, the precoder 203 performs the filtering F indicated by the following equation (2):

$$F = 1/(1 \oplus D) \quad (2)$$

where $\oplus$ denotes exclusive-OR.

The magnetic recording and/or reproducing apparatus 200 then converts respective bits of the precode signal D204, as binary signal supplied from the precoder 203, by the write current driver 204, into write current values $I_S$, such as by $0 \to -I_S$, $1 \to +I_S$, to generate a write current signal D205.

By the write head 205, the magnetic recording and/or reproducing apparatus 200 applies a magnetic write signal D206, corresponding to the write current signal D205 supplied from the write current driver 204, to the recording medium 250.

By the above processing, the magnetic recording and/or reproducing apparatus 200 is able to record data on the recording medium 250.

In reproducing the data recorded on the recording medium 250, the magnetic recording and/or reproducing apparatus 200 performs the following processing:

First, the magnetic recording and/or reproducing apparatus 200 reads out the readout magnetic signal D207 from the recording medium 250 by the readout head 206 to generate a readout current signal D208 conforming to this readout magnetic signal D207.

The magnetic recording and/or reproducing apparatus 200 then equalizes the readout current signal D208, supplied from the readout head 206, by the equalizer 207, so that the channel response since data writing on the recording medium 250 in the recording system until outputting thereof at the equalizer 207 will be of pre-set characteristics, such as 1-D, to generate an equalized signal D209.

The magnetic recording and/or reproducing apparatus 200 then adjusts the gain of the equalized signal D209, supplied from the equalizer 207, by the gain adjustment circuit 208, based on a gain adjustment control signal D213 from the gain adjustment control circuit 211, to generate a gain adjustment signal D210. Meanwhile, the gain adjustment control signal D213 is generated by the gain adjustment control circuit 211, based on the digital channel signal D211, as later explained. Specifically, the gain adjustment control signal D213 is a control signal for maintaining the amplitude of the equalization signal D209 at an expected value.

By the A/D converter 209, the magnetic recording and/or reproducing apparatus 200 digitizes the gain adjustment signal D210, supplied from the gain adjustment circuit 208, to generate the digital channel signal D211. Meanwhile, the A/D converter 209 performs sampling based on the clock signal D212 generated and supplied by the timing generating circuit 210. The timing generating circuit 210, fed with the digital channel signal D211, generates clocks to produce clock signals D212, which are output to the A/D converter 209.

The magnetic recording and/or reproducing apparatus 200 feeds the digital channel signal D211, supplied from the A/D converter 209, to the viterbi decoder 212, which then performs viterbi decoding on the channel response from the upstream side of the precoder 203 in the recording system up to the outputting at the equalizer 207 in the reproducing system, for example, on the channel response $R_{ch}$ represented by the following equation (3):

$$R_{ch} = (1-D)/(1 \oplus D) \quad (3)$$

where $\oplus$ denotes Exclusive-OR, to generate a viterbi decoded signal D214.

The magnetic recording and/or reproducing apparatus 200 then applies modulation decoding on the viterbi decoded signal D214, supplied from the modulation decoder 213, to realize data correspondence reversed from that in the modulation encoder 202 in the recording system to generate a modulated decoded signal D215 which is an original input data string not subjected to limitations.

The magnetic recording and/or reproducing apparatus 200 decodes the error correction codes of the modulated decoded signal D215, supplied from the modulation decoder 213, by the error correction decoder 214, to generate output data D216.

By the above processing, the magnetic recording and/or reproducing apparatus 200 is able to reproduce the data recorded on the recording medium 250.

Meanwhile, in the above-described conventional magnetic recording and/or reproducing apparatus 200, the modulation decoder 213 has no more than the function of realizing the correspondence between binary signals which is reversed from that obtained on modulation encoding by the modulation encoder 202, while the signals in both the input and the output of the modulation decoder 213 need to be binary signals, with the result that the signals on the downstream side of the viterbi decoder 212 are all binary signals.

In other words, it is necessary in the magnetic recording and/or reproducing apparatus 200 to generate binary signals on the upstream side of the modulation decoder 213 and to process the binary signals even on the downstream side of the modulation decoder 213.

Thus, in the magnetic recording and/or reproducing apparatus 200, in which bi-level binary signals need to be used, the information volume in the signal is diminished intentionally with the result that efficient decoding cannot be realized to deteriorate the decoding error rate.

SUMMARY OF THE INVENTION

It is therefore an object of the present invention to provide a method and apparatus for recording data in which high performance encoding may be carried out to cause the reproducing system to perform highly efficient decoding operations to lower the decoding error rate significantly.

It is another object of the present invention to provide a data reproducing method and apparatus for performing efficient decoding to lower the decoding error rate.

It is yet another object of the present invention to provide a data recording and/or reproducing method and apparatus for realizing high performance encoding and high efficiency decoding to lower the decoding error rate.

In one aspect, the present invention provides a data recording apparatus for recording data on a recording medium, including error correction encoding means for applying error correction coding to input data and interleaving means for interleaving data supplied from the error correction encoding means for re-arraying the data sequence.

In this data recording apparatus, according to the present invention, the sequence of data supplied from the error correction encoding means is interleaved by interleaving means for re-arraying the data sequence, thus realizing high performance encoding.

In another aspect, the present invention provides a data recording method for recording data on a recording medium, including an error correction encoding step of applying error correction coding to input data and an interleaving step of interleaving data supplied from the error correction encoding step for re-arraying the data sequence.

In this data recording method, according to the present invention, the sequence of data supplied from the error correction encoding means is interleaved in the interleaving step for re-arraying the data sequence.

In still another aspect, the present invention provides a data reproducing apparatus including error correction encoding means for applying error correction coding to input data and first interleaving means for interleaving data supplied from the error correction encoding means for re-arraying the data sequence, in which the data reproducing apparatus reproduces data recorded on a recording medium by a data recording equipment, the apparatus including deinterleaving means for interleaving the input data in its sequence for restoring the bit sequence of data re-arrayed by the first interleaving means to a bit sequence of data encoded by the error correction encoding means, error correction decoding means for decoding the error correction codes of data supplied from the deinterleaving means and second interleaving means for interleaving the sequence of data for interleaving and re-arraying the sequence of data given by a difference between data output from the error correction decoding means and data output from the deinterleaving means based on the same interleaving position information as that of the first interleaving means.

In this data reproducing apparatus, according to the present invention, data re-arrayed on interleaving by deinterleaving means is decoded by error correction decoding means, while data given as a difference between the data output from the error correction decoding means by second interleaving means and data output from the deinterleaving means is interleaved by second interleaving means for re-arraying the data sequence, thus realizing highly efficient decoding by exploiting the soft information for the entire decoding processing, thereby lowering the decoding error rate significantly.

In still another aspect, the present invention provides a data reproducing method including an error correction encoding step of applying error correction coding to input data and a first interleaving step of interleaving data supplied from the error correction encoding step for re-arraying the data sequence, in which the data reproducing method reproduces data recorded on a recording medium by a data recording equipment, the method including a deinterleaving step of interleaving the input data in its sequence for restoring the bit sequence of data re-arrayed by the first interleaving step to a bit sequence of data encoded by the error correction encoding step, an error correction decoding step of decoding the error correction codes of data supplied from the deinterleaving step and a second interleaving step of interleaving the sequence of data for re-arraying the sequence of data given by a difference between data decoded in the error correction decoding step and data output from the deinterleaving step based on the same interleaving position information as that of the first interleaving step.

In this data reproducing method, according to the present invention, data re-arrayed on interleaving by the deinterleaving step is decoded by the error correction decoding step, while data given as the difference between the data output from the error correction decoding step and data output from the deinterleaving step is interleaved by the second interleaving step for re-arraying the data sequence, thus realizing highly efficient decoding by exploiting the soft information for the entire decoding processing, thereby lowering the decoding error rate significantly.

In still another aspect, the present invention provides a data recording and reproducing apparatus for recording and reproducing data on or from a recording medium, wherein the apparatus includes, as a recording system for recording data on a recording medium, error correction encoding means for applying error correction encoding to input data and first interleaving means for interleaving data supplied from the error correction encoding means for re-arraying the data sequence, and wherein the apparatus includes, as a reproducing system for reproducing data recorded on the recording medium, deinterleaving means for interleaving the input data in its sequence for restoring the bit sequence of data re-arrayed by the first interleaving means to a bit sequence of data encoded by the error correction encoding means, error correction decoding means for decoding the error correction codes of data supplied from the deinterleaving means and second interleaving means for interleaving the sequence of data given by a difference between data output from the error correction decoding means and data output from the deinterleaving means based on the same interleaving position information as that of the first interleaving means.

In this data recording and reproducing apparatus, if data is to be recorded on the recording medium, data supplied from the error correction encoding means is interleaved by the first interleaving means for re-arraying the data sequence, whereas, if the data recorded on the recording medium is to be reproduced, the data interleaved by the deinterleaving means for re-arraying is decoded by the error correction decoding means and data given as the difference between the data output from the error correction decoding means and data output from the deinterleaving means is interleaved by second interleaving means for re-arraying the data sequence, thus realizing high performance encoding. Moreover, highly efficient decoding can be realized by exploiting the soft information for the entire decoding processing for this code, thereby significantly lowering the decoding error rate.

In still another aspect, the present invention provides a data recording and reproducing method for recording and reproducing data on or from a recording medium, wherein the method includes, as a recording system for recording data on a recording medium, an error correction encoding step of applying error correction encoding to input data and a first interleaving step of interleaving data supplied from the error correction encoding step for re-arraying the data sequence, and wherein the method includes, as a reproducing system for reproducing data recorded on the recording medium, a deinterleaving step of interleaving the input data in its sequence for restoring the bit sequence of data re-arrayed by the first interleaving step to a bit sequence of data encoded by the error correction encoding step, an error correction decoding step of decoding the error correction codes of data supplied from the deinterleaving step, and a second interleaving step of interleaving the sequence of data given by a difference between data output from the error correction decoding step and data output from the deinterleaving step based on the same interleaving position information as that of the first interleaving step.

In this data recording and reproducing method, if data is to be recorded on the recording medium, data supplied from the error correction encoding step is interleaved by the first interleaving step for re-arraying the data sequence, whereas, if the data recorded on the recording medium is to be reproduced, the data interleaved by the deinterleaving step for re-arraying is decoded by the error correction decoding step and data given as the difference between the data output from the error correction decoding step and data output from the deinterleaving step is interleaved by the second interleaving step for re-arraying the data sequence, thus realizing high performance encoding. Moreover, highly efficient decoding can be realized by exploiting the soft information for the entire decoding processing for this code, thereby significantly lowering the decoding error rate.

DESCRIPTION OF THE PREFERRED EMBODIMENTS

Figure 1:
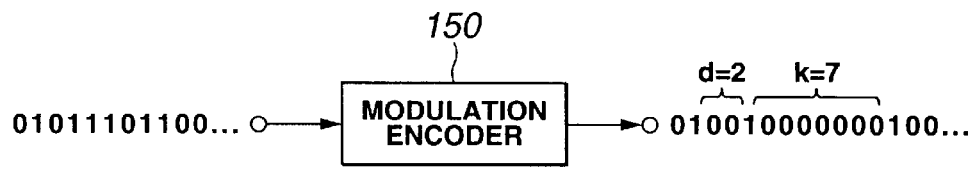
FIG. 1 illustrates an input/output example of a conventional modulation encoder.
Figure 2:
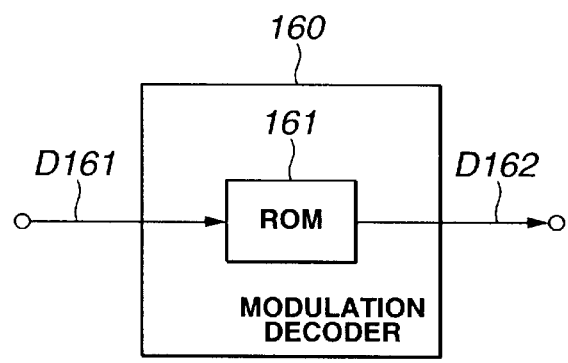
FIG. 2 is a block diagram showing the structure of a conventional modulation decoder.
Figure 3:
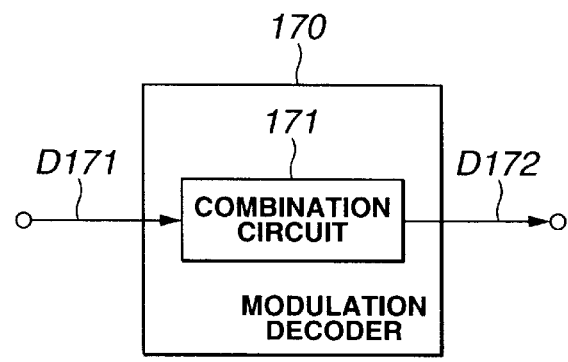
FIG. 3 is a block diagram showing the structure of another conventional modulation decoder.
Figure 4:
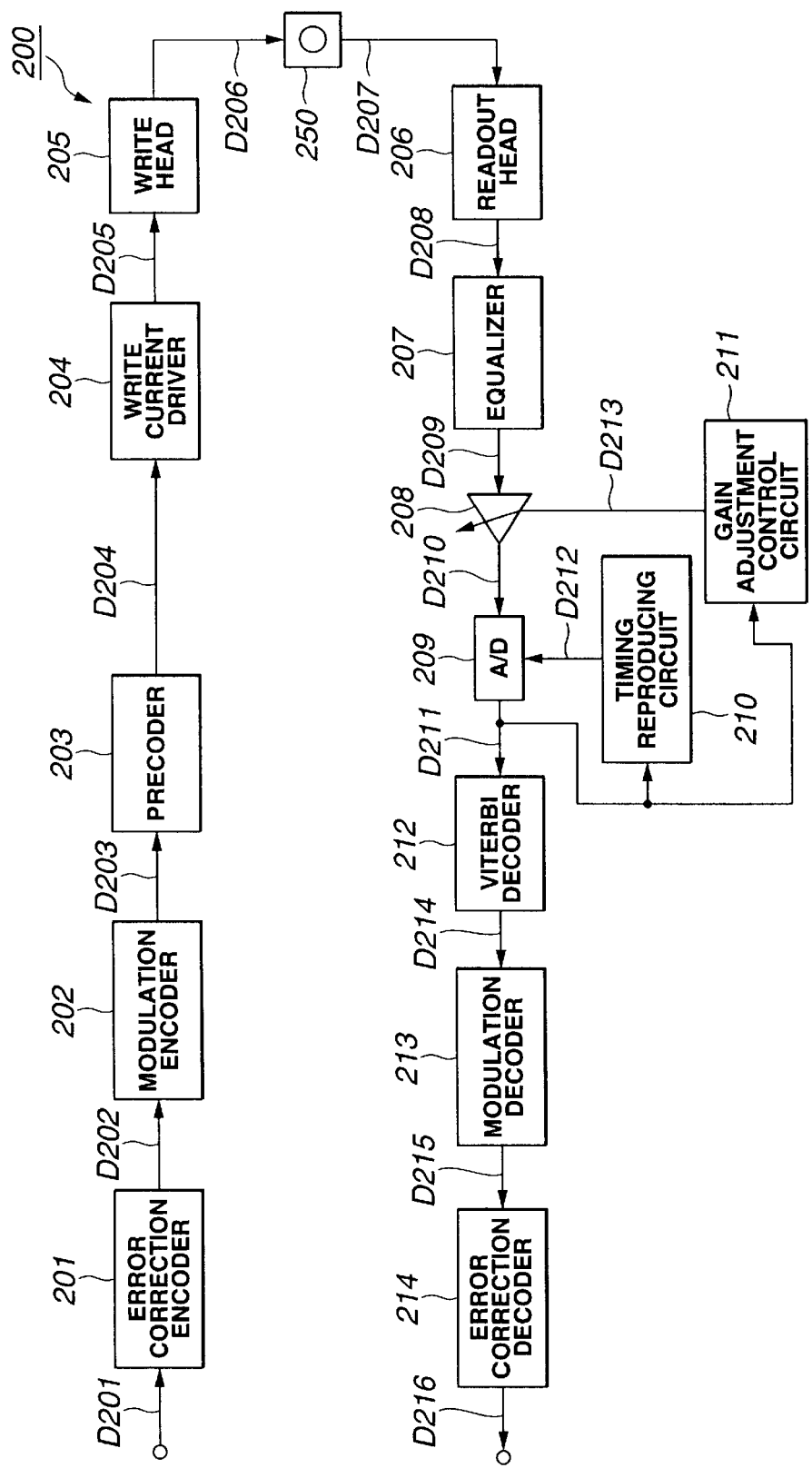
FIG. 4 is a block diagram showing the structure of a conventional magnetic recording and/or reproducing apparatus.

Referring to the drawings, preferred embodiments of the present invention will be explained in detail.

The present embodiment is directed to a magnetic recording and/or reproducing apparatus made up of a recording system for recording data on a recording medium of the magnetic recording system, such as a hard disc or a so-called DVCR (digital video cassette recorder), and a reproducing system for reproducing data recorded on these recording mediums.

This magnetic recording and/or reproducing apparatus includes, in its recording system, an interleaver downstream of an error correction encoder for error correction coding input data, and executes encoding by so-called serial concatenated coding between the error correction encoder and a modulation encoder used for signal modulation. In addition, the magnetic recording and/or reproducing apparatus includes, in its reproducing system, a soft input soft output (SISO) decoder, fed with data as a soft input and issuing data as a soft output, as a decoder for modulation decoding modulation-encoded signals and as a decoder for error correction decoding the input data, and executes iterative decoding, termed turbo decoding, between these two decoders. That is, the magnetic recording and/or reproducing apparatus applies the encoding and turbo decoding, using the serial concatenated code, known as the encoding method and decoding method giving the performance close to the Shannon limit as set by what is called the Shannon's theorem on the channel coding, to a recording and/or reproducing system performing data recording and/or reproduction for a recording medium.

First, the magnetic recording and/or reproducing apparatus as a first embodiment is explained. Here, the decoder for modulation-decoding the modulation-encoded signals, as a SISO decoder applied to the reproducing system of the present magnetic recording and/or reproducing apparatus, is explained by referring to FIGS. 5 and 6. It should be noted that, although the decoders 10, 20, shown in FIGS. 5 and 6, are shown as decoders for modulation-decoding the modulation-encoded signals, the decoder for performing the error correction decoding is realized in a similar manner.

Figure 5:
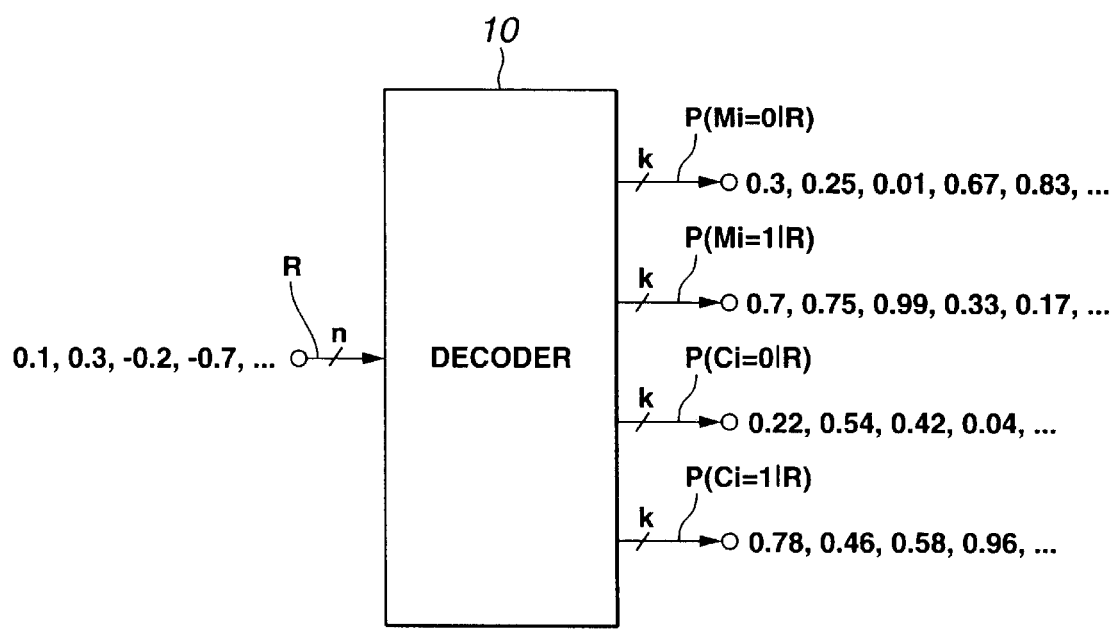
FIG. 5 illustrates an input/output example in a decoder applied to a reproducing system of a magnetic recording and/or reproducing apparatus shown as a first embodiment of the present invention.
Figure 6:
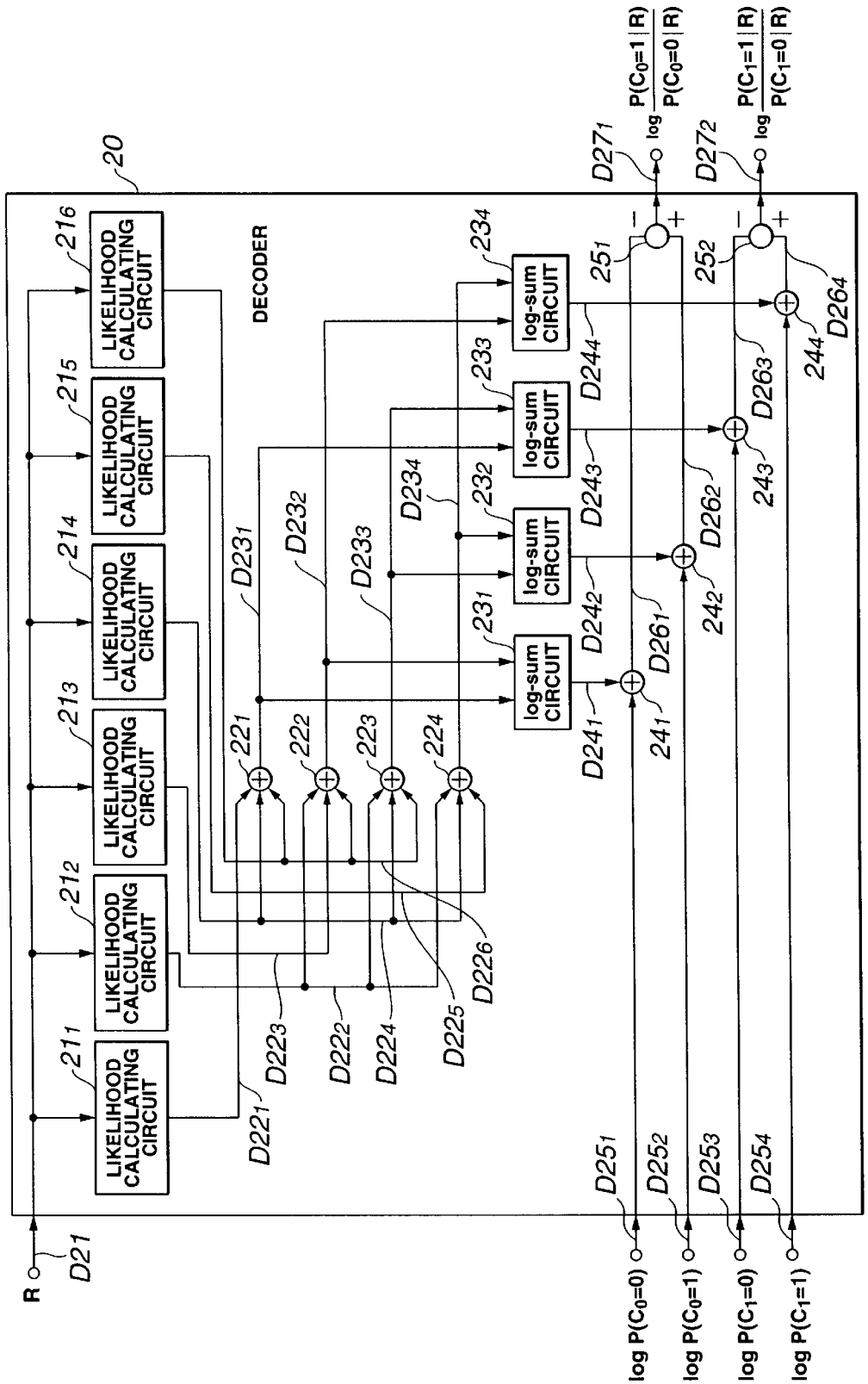
FIG. 6 is a block diagram for illustrating the structure of a decoder used in the reproducing system of the magnetic recording and/or reproducing apparatus shown in FIG. 5.

A decoder 10, shown in FIG. 5, decodes data encoded by block modulation, with the code rate R=k/n, where k is the number of input bits and n is the number of bits for modulation coding.

When fed with a reception signal R as the soft input, the decoder 10 calculates the probability $P(R_i=0|R)$ that the respective bits of this reception signal R are each "0" and the probability $P(R_i=1|R)$ that the respective bits of this reception signal R are each "1". Ultimately, the modulation decoder 10 calculates a posterior probability information $P(M_i=0|R)$ and $P(M_i=1|R)$, as soft decision values for a modulation code block M represented by $M=(M_0, M_1, \ldots, M_{n-1})$, and/or a posterior probability information $P(C_i=0|R)$ and $P(C_i=1|R)$, as soft decision values for a modulation code input block C represented by $C=(C_0, C_1, \ldots, C_{k-1})$, to output the so-calculated information.

Instead of individually outputting the aforementioned posterior probability information, the decoder is also able to output the logarithmic value of the ratio of the posterior probability information, that is $\log(P(M_i=1|R)/P(M_i=0|R))$ or $\log(P(C_i=1|R)/P(C_i=0|R))$. These log values are routinely termed the log likelihood ratio and here denote the likelihood of the modulating code block M and the modulating code input block C on the occasion of inputting the reception signal R.

The decoder may also be fed with the priori probability information $P(C_i=0)$ and $P(C_i=1)$ for a modulation code input block C, instead of being fed with the aforementioned reception signal R.

Specifically, the decoder may, for example, be configured as shown in FIG. 6. In the following explanation, it is assumed that, for generating a three-bit output for a two-bit input, data to be decoded has been encoded in accordance with the conversion table shown in Table 3:

TABLE 3

Example of Conversion Table

| input bits | output bits |
|---|---|
| 00 | 011 |
| 01 | 101 |
| 10 | 111 |
| 11 | 110 |

The modulation decoder 20, shown in FIG. 6, includes six likelihood calculating circuits $21_1$, $21_2$, $21_3$, $21_4$, $21_5$ and $21_6$, as means for calculating the likelihood of each reception bit, four adders $22_1$, $22_2$, $22_3$ and $22_4$ for summing the data, four log-sum circuits $23_1$, $23_2$, $23_3$ and $23_4$ for performing the operations of log $(e^A+e^B)$ on the two data A and B, four adders $24_1$, $24_2$, $24_3$ and $24_4$ for summing two data and two comparators $25_1$, $25_2$ for taking the ratio of the two data. It is noted that the number six of the likelihood calculating circuits is derived from three bits multiplied by 2 equals to six bits.

The likelihood calculating circuits $21_1$, $21_2$, $21_3$, $21_4$, $21_5$ and $21_6$ are respectively fed with respective reception bits in a reception signal D21 (R) to calculate the likelihood of the respective reception bits.

That is, the likelihood calculating circuits $21_1$ is fed with the 0th bit of the three-bit reception signal D21 to calculate the log probability value $D22_1(\log P(R_0=0|R))$ corresponding to the log value of the probability that this bit is "0". The likelihood calculating circuits $21_2$ sends the generated log probability value $D22_1$ to the adder $22_1$.

The likelihood calculating circuits $21_2$ is fed the 0th bit of the three-bit reception signal D21 to calculate the log probability value $D22_2(\log P(R_0=1|R))$ corresponding to the log value of the probability that this bit is "1". The likelihood calculating circuits $21_2$ sends the generated log probability value $D22_2$ to the adders $22_2$, $22_3$ and $22_4$.

Then, the likelihood calculating circuits $21_3$ is fed with the first bit of the three-bit reception signal D21 to calculate the log probability value $D22_3(\log P(R_1=0|R))$ corresponding to the log value of the probability that this bit is "0". The likelihood calculating circuits $21_3$ sends the generated log probability value $D22_3$ to the adder $22_2$.

The likelihood calculating circuits $21_4$ is fed the first bit of the three-bit reception signal D21 to calculate the log probability value $D22_4(\log P(R_1=1|R))$ corresponding to the log value of the probability that this bit is "1". The likelihood calculating circuits $21_4$ sends the generated log probability value $D22_4$ to the adder $22_1$, $22_3$ and $22_4$.

Then, the likelihood calculating circuits $21_5$ is fed with the second bit of the three-bit reception signal D21 to calculate the log probability value $D22_5(\log P(R_2=0|R))$ corresponding to the log value of the probability that this bit is "0". The likelihood calculating circuits $21_5$ sends the generated log probability value $D22_5$ to the adder $22_4$.

The likelihood calculating circuits $21_6$ is fed with the first bit of the three-bit reception signal D21 to calculate the log probability value $D22_6(\log P(R_2=1|R))$ corresponding to the log value of the probability that this bit is "1". The likelihood calculating circuits $21_6$ sends the generated log probability value $D22_6$ to the adders $22_1$, $22_2$ and $22_3$.

The adder $D22_1$ sums the log probability value $D22_1$, supplied from the likelihood calculating circuits $21_1$, the log probability value $D22_4$, supplied from the likelihood calculating circuits $21_4$, and the log probability value $D22_6$, supplied from the likelihood calculating circuits $21_6$, to generate the likelihood value $D23_1$. That is, this likelihood value $D23_1$ is not other than the probability represented by log $P(R|M_0M_1M_2=011)$. The adder $D22_1$ sends the generated likelihood value $D23_1$ to the log-sum circuits $23_1$, $23_3$.

The adder $D22_2$ sums the log probability value $D22_2$, supplied from the likelihood calculating circuits $21_2$, the log probability value $D22_3$, supplied from the likelihood calculating circuits $21_3$ and the log probability value $D22_6$, supplied from the likelihood calculating circuits $21_6$ to generate the likelihood value $D23_2$. That is, this likelihood value $D23_2$ is not other than the probability represented by log $P(R|M_0M_1M_2=101)$. The adder $D22_2$ sends the generated likelihood value $D23_2$ to the log-sum circuits $23_1$, $23_4$.

The adder $D22_3$ sums the log probability value $D22_2$, supplied from the likelihood calculating circuits $21_2$, the log probability value $D22_4$, supplied from the likelihood calculating circuits $21_4$ and the log probability value $D22_6$, supplied from the likelihood calculating circuits $21_6$ to generate the likelihood value $D23_3$. That is, this likelihood value $D23_3$ is not other than the probability represented by log $P(R|M_0M_1M_2=111)$. The adder $D22_3$ sends the generated likelihood value $D23_3$ to the log-sum circuits $23_2$, $23_3$.

The adder $D22_4$ sums the log probability value $D22_2$, supplied from the likelihood calculating circuits $21_2$, the log probability value $D22_4$, supplied from the likelihood calculating circuits $21_4$ and the log probability value $D22_5$, supplied from the likelihood calculating circuits $21_5$ to generate the likelihood value $D23_4$. That is, this likelihood value $D23_4$ is not other than the probability represented by log $P(R|M_0M_1M_2=110)$. The adder $D22_4$ sends the generated likelihood value $D23_4$ to the log-sum circuits $23_2$, $23_4$.

The log-sum circuit $23_1$ performs an operation shown by the equation (4):

$$\log(e^{\log P(R|M_0M_1M_2=011)}+e^{\log P(R|M_0M_1M_2=101)})=\log(P(R|M_0M_1M_2=011)+P(R|M_0M_1M_2=101)) \quad (4)$$

on the likelihood value $D23_1$ supplied from the adder $22_1$ and on the likelihood value $D23_2$ supplied from the adder $22_2$ to generate a likelihood value $D24_1$. The log-sum circuit $23_1$ sends the so-generated likelihood value $D24_1$ to the adder $24_1$.

The log-sum circuit $23_2$ performs an operation shown by the equation (5):

$$\log(e^{\log P(R|M_0M_1M_2=111)}+e^{\log P(R|M_0M_1M_2=110)})=\log(P(R|M_0M_1M_2=111)+P(R|M_0M_1M_2=110)) \quad (5)$$

on the likelihood value $D23_3$ supplied from the adder $22_3$ and on the likelihood value $D23_4$ supplied from the adder $22_4$ to generate a likelihood value $D24_2$. The log-sum circuit $23_2$ sends the so-generated likelihood value $D24_2$ to the adder $24_2$.

The log-sum circuit $23_3$ performs an operation shown by the equation (6):

$$\log(e^{\log P(R|M_0M_1M_2=011)}+e^{\log P(R|M_0M_1M_2=111)})=\log(P(R|M_0M_1M_2=011)+P(R|M_0M_1M_2=111)) \quad (6)$$

on the likelihood value $D23_1$ supplied from the adder $22_1$ and on the likelihood value $D23_3$ supplied from the adder $22_3$ to generate a likelihood value $D24_3$. The log-sum circuit $23_3$ sends the so-generated likelihood value $D24_3$ to the adder $24_3$.

The log-sum circuit $23_4$ performs an operation shown by the equation (7):

$$\log(e^{\log P(R|M_0M_1M_2=101)}e^{\log P(R|M_0M_1M_2=110)})=\log(P(R|M_0M_1M_2=101)+P(R|M_0M_1M_2=110)) \quad (7)$$

on the likelihood value $D23_2$ supplied from the adder $22_2$ and on the likelihood value $D23_4$ supplied from the adder $22_4$ to generate a likelihood value $D24_4$. The log-sum circuit $23_4$ sends the so-generated likelihood value $D24_4$ to the adder $24_4$.

The adder $24_1$ sums the likelihood value $D24_1$ supplied from the log-sum circuit $23_1$ and the log priori probability $D25_1$ (logP($C_0$=0)) for an input bit, fed from outside, to generate the log probability value $D26_1$. This log probability value $D26_1$ denotes the probability shown by the following equation (8):

$$\log P(C_0=0|R)=\log\{P(R|M_0M_1M_2=011)+(R|M_0M_1M_2=101)\}+\log P(C_0=0) \quad (8)$$

The adder $24_1$ sends the generated log probability value $D26_1$ to a comparator $25_1$.

The adder $24_2$ sums the likelihood value $D24_2$ supplied from the log-sum circuit $23_2$ and the log priori probability $D25_2$ (logP($C_0$=1)) for an input bit, input from outside, to generate the log probability value $D26_2$. This log probability value $D26_2$ denotes the probability shown by the following equation (9):

$$\log P(C_0=1|R)=\log\{P(R|M_0M_1M_2=111)+(R|M_0M_1M_2=111)\}+\log P(C_0=1) \quad (9)$$

The adder $24_2$ sends the generated log probability value $D26_2$ to a comparator $25_1$.

The adder $24_3$ sums the likelihood value $D24_3$ supplied from the log-sum circuit $23_3$ and the log priori probability $D25_3$ (logP($C_1$=0)) for an input bit, input from outside, to generate the log probability value $D26_3$. This log probability value $D26_3$ denotes the probability shown by the following equation (10):

$$\log P(C_1=0|R)=\log\{P(R|M_0M_1M_2=011)+(R|M_0M_1M_2=111)\}+\log P(C_1=0) \quad (10)$$

The adder $24_3$ sends the generated log probability value $D26_3$ to a comparator $25_2$.

The adder $24_4$ sums the likelihood value $D24_4$ supplied from the log-sum circuit $23_4$ and the log priori probability $D25_4$ (logP($C_1$=1)) for an input bit, input from outside, to generate the log probability value $D26_4$. This log probability value $D26_4$ denotes the probability shown by the following equation (11):

$$\log P(C_1=1|R)=\log\{P(R|M_0M_1M_2=101)+(R|M_0M_1M_2=110)\}+\log P(C_1=1) \quad (11)$$

The adder $24_4$ sends the generated log probability value $D26_4$ to a comparator $25_2$.

The comparator $25_1$ takes the ratio of the log probability value $D26_1$ supplied from the adder $24_1$ and the log probability value $D26_2$ supplied from the adder $24_2$ to generate the decoded log posterior probability ratio $D27_1$ ($\log(P(C_0=1|R)/P(C_0=0|R))$) which is output.

The comparator $25_2$ takes the ratio of the log probability value $D26_3$ supplied from the adder $24_3$ and the log probability value $D26_4$ supplied from the adder $24_4$ to generate the decoded log posterior probability ratio $D27_2$ ($\log(P(C_1=1|R)/P(C_1=0|R))$) which is output.

The modulation decoder 20, having the components as described above, has the likelihood calculating circuits $21_1$, $21_2$, $21_3$, $21_4$, $21_5$ and $21_6$ for calculating the likelihood of respective reception bits in the reception signals D21(R) taking analog values under the effect of the noise generated in the course of transmission, as soft input, that is the respective output codewords on the modulation coder side. By these likelihood calculating circuits $21_1$, $21_2$, $21_3$, $21_4$, $21_5$ and $21_6$, the modulation decoder 20 finds the likelihood of the respective codewords and uses the likelihood values, thus found, to find the posterior probability information straightforwardly, as soft decision values for the input and output bits on the modulation coder side.

Meanwhile, the modulation decoder 20 is fed from outside with log priori probability $D25_1$, $D25_2$, $D25_3$, $D25_4$. If the probability of the respective bits making up the binary signal input to the modulation coder, not shown, being "0", is equivalent to the same probability being "1", there is no necessity of inputting the log priori probability $D25_1$, $D25_2$, $D25_3$, $D25_4$, it being only necessary to handle the same as if the values of these log priori probability $D25_1$, $D25_2$, $D25_3$, $D25_4$ are all equal to zero.

Although the above explanation is based on the assumption that the modulation decoder 20 decodes data obtained on modulation-coding a 2-bit input to a 3-bit output, the modulation decoder is not limited as to the number of bits of the input or the output and may be similarly configured in keeping with the number of bits of the input or the output used.

Figure 7:
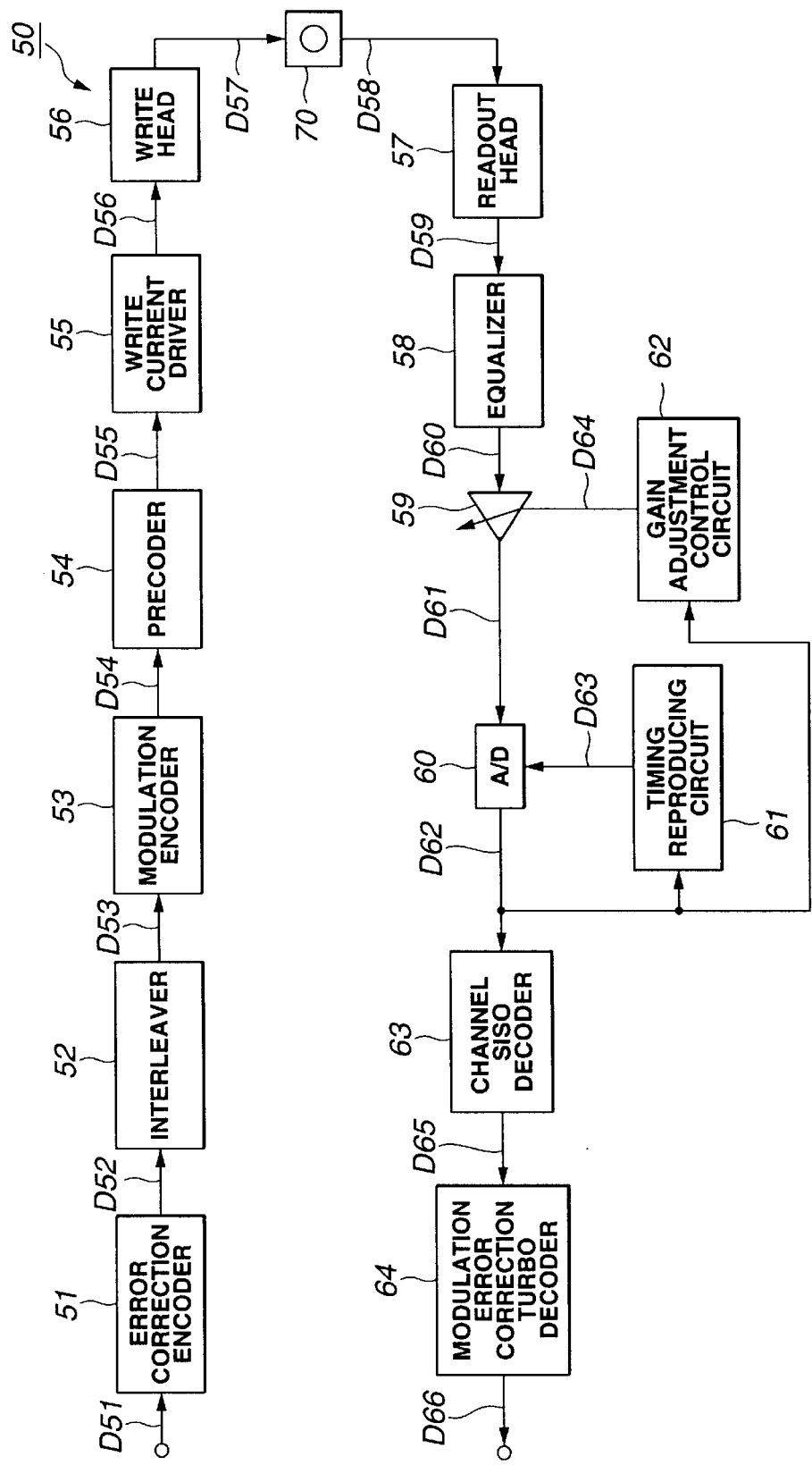
FIG. 7 is a block diagram for illustrating the structure of the recording and/or reproducing apparatus shown in FIG. 5.

Referring to FIG. 7, the magnetic recording and/or reproducing apparatus, employing this decoder, is hereinafter explained.

A magnetic recording and/or reproducing apparatus 50, shown in FIG. 7, includes, as a recording system for recording data on a recording medium 70, an error correction coder 51 for error correction coding input data, an interleaver 52 for re-arraying input data, a modulation encoder 53 for modulation coding input data, a precoder 54 for filtering the input data for compensating for channel characteristics, a write current driver 55 for converting respective bits of the input data into write current values, and a write head 56 for recording data on a recording medium 70.

The error correction coder 51, as error correction encoding means, applies error correction coding to the input data D51. The error correction coder 51 sends the error correction encoded data D52, generated on error correction coding, to the downstream side interleaver 52.

The interleaver 52, as (first) interleaving means, interleaves the error correction encoded data D52, supplied from the error correction coder 51, to re-array the sequence of the respective bits making up the error correction encoded data D52. For example, the interleaver 52 sequentially holds the respective bits making up the error correction encoded data D52 and re-arrays the bits, based on the interleaver position information, at a timing the bit sequence made up of the N bits, where N is an optional natural number, is formed, after which the interleaver 52 sends the re-arrayed bits as an interleaved data D53 at a predetermined timing to the downstream side modulation encoder 53.

The modulation encoder 53, as modulation encoding means, modulation-encodes the interleaved data D53, supplied from the interleaver 52, to generate a modulation-encoded data D54 as a sequence subjected to limitations. The modulation encoder 53 sends the so-generated modulation-encoded data D54 to the downstream side precoder 54.

The precoder 54 as precoding means applies filtering to the modulation-encoded data D54, supplied from the modulation encoder 53, in such a manner as to compensate for channel characteristics from the data writing to the recording medium 70 to the outputting thereof in the equalizer 58 in the reproducing system, thereby generating a precode signal D55 as a binary signal. For example, if the channel of the precoder has 1–D characteristics the precoder 54 performs filtering F represented by the following equation (12):

$$F = 1/(1 \oplus D) \qquad (12)$$

where $\oplus$ denotes exclusive-OR. The precoder 53 sends the generated precode signal D55 to the downstream side write current driver 55.

The write current driver 55 converts respective bits of the precode signal D55, supplied from the precoder 54, into the write current value $I_S$, so that 0 and 1 will be converted to $-I_S$ and $+I_S$ ($0 \rightarrow -I_S$, $1 \rightarrow +I_S$), respectively, to generate a write current signal D56. The write current driver 55 sends the so-generated write current signal D56 to the downstream side write head 56.

The write head 56 routes a write magnetic signal D57, conforming to the write current signal D56, supplied from the write current driver 55, to the recording medium 70 to record data thereon.

When recording data on the recording medium 70, the recording system in this magnetic recording and/or reproducing apparatus 50 applies error correction coding to the input data D51, by the error correction coder 51, to produce error correction coded data D52, which then is interleaved by the interleaver 52. The recording system also modulation encodes the interleaved data D53 in a pre-set fashion by the modulation encoder 53 to generate a precode signal D55 by the precoder 54.

The recording system records the precode signal D55, generated by the precoder 54, on the recording medium 70, through the write current driver 55 and the write head 56.

The recording system in the magnetic recording and/or reproducing apparatus 50 thus includes the interleaver 52 downstream of the error correction coder 51, and executes serial concatenated coding between the error correction encoder 51 and the modulation encoder 53 to realize high performance encoding as error correction encoding and modulation encoding.

On the other hand, the magnetic recording and/or reproducing apparatus 50 includes, as a reproducing system for reproducing the data recorded on the recording medium 70, a readout head 57 for reading out data recorded on the recording medium 70, an equalizer 58 for equalizing input data, a gain adjustment circuit 59 for adjusting the gain of the input data, an analog/digital (A/D) converter 60 for converting analog data into digital data, a timing reproducing circuit 61 for reproducing clocks, a gain adjustment control circuit 62 for controlling the gain adjustment circuit 59, a channel SISO decoder 63, as a SISO decoder for performing decoding for the channel response from the pre-stage of the precoder 54 in the recording system up to the equalizer 58 in the reproducing system, and a modulation and error correction turbo decoder 64 for turbo decoding the input data.

The readout head 57 reads out a readout magnetic signal D58 from the recording medium and generates a readout current signal D59 corresponding to this readout magnetic signal D58. The readout head 57 sends the generated readout current signal D59 to the downstream side equalizer 58.

The equalizer 58 equalizes the readout magnetic signal D58, supplied from the readout head 57, so that the channel response from data writing on the recording medium 70 in the recording system up to outputting thereof in the equalizer 58 will be of pre-set characteristics, such as 1–D, in order to generate an equalized signal D60. The equalizer 58 sends the generated equalized signal D60 to the downstream side gain adjustment circuit 59.

The gain adjustment circuit 59 adjusts the gain of the equalized signal D60, supplied from the equalizer 58, based on the gain adjustment control signal D64 supplied from the gain adjustment control circuit 62, to generate a gain adjustment signal D61. The gain adjustment circuit 59 sends the generated gain adjustment signal D61 to the downstream side A/D converter 60.

The A/D converter 60 samples the gain adjustment signal D61, supplied from the gain adjustment circuit 59, based on the clock signal D63 supplied from the timing generating circuit 61, to digitize the gain adjustment signal D61 to generate a digital channel signal D62. The A/D converter 60 sends the so-generated digital channel signal D62 to the timing generating circuit 61, gain adjustment control circuit 62 and to the channel SISO decoder 63.

The timing generating circuit 61 regenerates clocks from the digital channel signal D62, supplied from the A/D converter 60, to generate clock signals D63. The timing generating circuit 61 routes the generated clock signals D63 to the A/D converter 60.

Based on the digital channel signal D62, supplied from the A/D converter 60, the gain adjustment control circuit 62 generates a gain adjustment control signal D64, which is a control signal used for maintaining the amplitude of the equalized signal D60 at an expected value. The gain adjustment control circuit 62 sends the generated gain adjustment control signal D64 to the gain adjustment circuit 59.

The channel SISO decoder 63 is fed with a digital channel signal D62, supplied from the A/D converter 60, executes soft output decoding, based on the so-called BCJR (Bahl, Cocke, Jelinek and Rahiv) algorithm or SOVA (soft output viterbi algorithm), in accordance with the trellis corresponding to the channel response from the pre-stage of the precoder 54 in the recording system up to outputting in the equalizer 58 in the reproducing system, for example, the channel response $R_{ch}$ represented by the following equation (13):

$$R_{ch}=(1-D)/(1\oplus D) \qquad (13)$$

where $\oplus$ denotes exclusive OR, to generate a channel soft output signal D65.

The modulation and error correction turbo decoder 64 executes turbo decoding by concatenating SISO type decoders constructed as the aforementioned decoders 10, 20. The modulation and error correction turbo decoder 64 is fed with the channel soft output signal D65, supplied from the channel SISO decoder 63, to effect turbo decoding, as will be explained later in detail, to output the decoded results as soft or hard output data D66 to outside.

Figure 8:
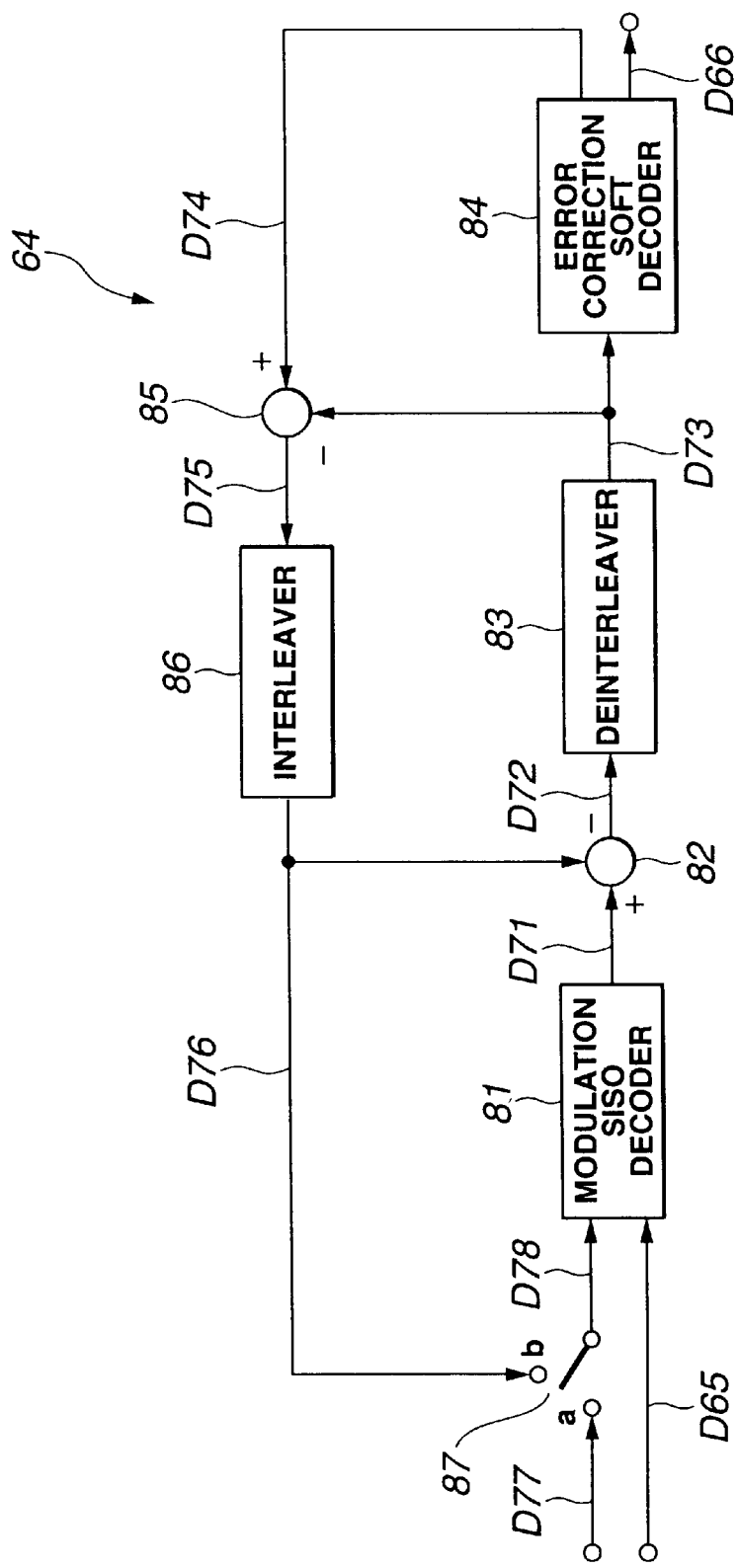
FIG. 8 is a block diagram for illustrating the structure a modulation and error correction turbo decoder provided in the reproducing system of the magnetic recording and/or reproducing apparatus shown in FIG. 5.

Referring to FIG. 8, the modulation and error correction turbo decoder 64 will be explained in detail.

In FIG. 8, the modulation and error correction turbo decoder 64 includes a modulation SISO decoder 81, as an SISO decoder for modulation decoding input data, a deinterleaver 83 for restoring the sequence of the input data to the original sequence, an error correction soft decoder 84 for error correcting soft decoding the input data, interleaver 86 for re-arraying the input data, a changeover switch 87 for switching data input as priori probability information for an information bit, and two difference taking units 82, 85.

The modulation SISO decoder 81, as modulation decoder means, is constructed as the aforementioned decoders 10, 20, and is a SISO decoder. The modulation SISO decoder 81, is fed with a channel soft output signal D65, as a soft input, supplied from the channel SISO decoder 63, and with a priori probability information signal D78, as selected by the changeover switch 87 from the priori probability information signal D76 for the information bit as a soft input supplied from the interleaver 86 or the priori probability information signal D77 for an information bit having a value of "0", to perform soft output decoding based on the aforementioned BCJR algorithm and on the SOVA algorithm. If the interleaved data D53 prior to modulation encoding by the modulation encoder 53 in the recording system is represented by M(t) (0≦t≦N), the modulation SISO decoder 81 calculates the log posterior probability ratio log (P(M(t)=1)/P(M(t)=0)), which is the posterior probability information for M(t), to send this log posterior probability ratio as the modulation decoded signal D71 to the difference taking unit 82.

The difference taking unit 82 takes the difference between the modulation decoded signal D71, as a soft input, supplied from the modulation SISO decoder 81, and the priori probability information signal D76, as a soft input, supplied from the interleaver 86, to output data represented by the difference value as a soft output to the post-stage deinterleaver 83, as a modulation extrinsic information signal D72, which is the extrinsic information to an information bit as found by the code constraint condition. Meanwhile, this modulation extrinsic information signals D72 corresponds to the interleaved data D53 obtained by the interleaver 52 of the recording system.

The deinterleaver 83, as deinterleaving means, deinterleaves the modulation extrinsic information signals D72, as a soft input, supplied from the difference taking unit 82, in order to restore the bit sequence of the interleaved data D53 from the interleaver 52 of the recording system to the bit sequence of the original error correction encoded data D52. The deinterleaver 83 sends the deinterleaved data to the error correction soft decoder 84 and to the difference taking unit 85 as the deinterleaved signal D73 which is the priori probability information to the code bit in the error correction soft decoder 84.

The error correction decoder 84 as error correction decoding means performs soft decoding of an error correction code, based on the aforementioned BCJR algorithm or SOVA on the deinterleaved signal D72 supplied from the deinterleaver 83. It is assumed that the error correction encoded data D52 following the error correction encoder 51 in the recording system is expressed as E(t) (o≦t≦N) and that the input data D51 prior to error correction encoding by the error correction coder 51 is expressed as I(t) (0≦t≦K). The error correction soft decoder 84 calculates the log posterior probability ratio log (P(E(t)=1)/P(E(t)=0)), which is the posterior probability information for E(t), and routes this log posterior probability ratio as the modulation error correction decoded signal D74 to the difference taking unit 85, while calculating the log posterior probability ratio log (P(I(t)=1)/P(I(t)=0)), which is the posterior probability information for I(t), to send the decoded result corresponding to this log posterior probability ratio as soft or hard output data D66 to outside.

The difference taking unit 85 finds a difference between the modulation error correction decoded signal D74, as a soft input, supplied from the error correction soft decoder 84, and the deinterleaved signal D73, as a soft input, supplied from the deinterleaver 83, to route the data represented by this difference value as a soft output to the downstream side interleaver 86 as the error correction extrinsic information signals D75 to the code bit as found by the code constraint condition.

The interleaver 86, as the second interleaving means, interleaves the error correction extrinsic information signals D75, as a soft input fed from the difference taking unit 85, based on the same interleaving position information as that of the interleaver 52 of the recording system. The interleaver 86 sends the interleaved data to the modulation SISO decoder 81 and to the difference taking unit 82 as being the priori probability information signal D76 for the information bit in the modulation SISO decoder 81.

In the initial stage of the decoding, the changeover switch 87 is set to the fixed terminal a supplying a value 0 corresponding to the priori probability information signal D77 to select the priori probability information signal D77 as being the priori probability information signal D78 for an information bit in the modulation SISO decoder 81. The changeover switch 87 then is set to a fixed terminal b supplying the priori probability information signal D76 from the interleaver 86 to select the priori probability information signal D76 as being the priori probability information signal D78.

The modulation and error correction turbo decoder 64, is provided with the error correction soft decoder 84 and the modulation SISO decoder 81, as counterparts to the error correction encoder 51 and the modulation encoder 53 of the recording system, respectively, as described above, to decompose the code of high decoding complexity into elements with lower decoding complexity, such as to sequentially improve characteristics by the interaction between the modulation SISO decoder 81 and the error correction soft decoder 84. If fed with the channel soft output signal D65, supplied from the channel SISO decoder 63, the modulation and error correction turbo decoder 64 iterates the decoding operations from the modulation SISO decoder 81 to the error correction soft decoder 84 a pre-set number of times, such as several to tens of times, to output the soft-output log posterior probability ratio, obtained on decoding a pre-set number of times, as the soft output data D66, directly to outside. Alternatively, the modulation and error correction turbo decoder 64 binary-codes the soft-output log posterior probability ratio, by a binary-coding circuit, not shown, to output the binary data as hard output data D66 to outside.

In reproducing data recorded on the recording medium 70, the reproducing system of the magnetic recording and/or reproducing apparatus 50 soft-output-decodes the soft-input digital channel signal D62, generated through the readout head 57, equalizer 58, gain adjustment circuit 59 and the A/D converter 60, by the channel SISO decoder 63, to generate the channel soft output signal D65 corresponding to the modulation encoded data D53 input to the precoder 54 in the recording system.

This reproducing system turbo-decodes the channel soft output signal D65, generated by the channel SISO decoder 63, for error correction codes, by the modulation and error correction turbo decoder 64, to output data as resulting soft output directly to outside as output data D66, or binary-codes the soft-output data to generate hard-output data D66, which is issued to outside.

The reproducing system of the magnetic recording and/or reproducing apparatus 50 is provided in this manner with the modulation and error correction turbo decoder 64 and performs turbo decoding between the error correction soft decoder 84 and the modulation SISO decoder 81 corresponding to the error correction encoder 51 and the modulation coder 53 of the recording system, respectively, to realize the decoding in meeting with the modulation encoding and error correction coding.

In the above-described magnetic recording and/or reproducing apparatus 50, in which the interleaver 52 is provided in the recording system on the post-stage of the modulation coder 51 to execute encoding by serial concatenated coding between the error correction encoder 51 and the modulation encoder 53, while the modulation and error correction turbo decoder 64 is provided on the reproducing system to effect turbo decoding to realize high performance coding. In addition, turbo decoding with high efficiency can be realized by exploiting the soft information for the entire decoding processing for the code, thus eliminating the necessity of diminishing the information, thereby appreciably lowering the decoding error rate.

The second embodiment of the magnetic recording and/or reproducing apparatus is now explained. The magnetic recording and/or reproducing apparatus executes encoding as correlation is afforded to fore and aft side data, instead of executing coding/decoding on the block basis, at least at the time of modulation encoding and decoding. In addition, the magnetic recording and/or reproducing apparatus performs trellis decoding conforming to the constraint condition.

Referring to FIGS. 9 to 12, the encoder and the SISO decoder applied to the recording system and the reproducing system of the present magnetic recording and/or reproducing apparatus are explained. It should be noted that, although the encoder and the decoder are shown here as being used for modulation encoding and modulation decoding, respectively, the encoder and decoder performing error correction encoding and error correction decoding, respectively, are also realized in a similar fashion.

The magnetic recording and/or reproducing apparatus performs modulation encoding and modulation decoding, based on a common trellis. Although the trellis structure is changed depending on limitations imposed on the modulation code, the modulation encoding and modulation decoding, satisfying the (d, k)=(0, 2) limitations, with the code rate R=2/3, is here explained.

Figure 9:
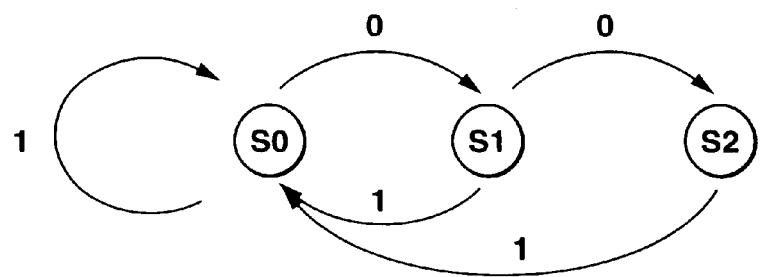
FIG. 9 illustrates the status transition diagram for generating codes satisfying the (d, k)=(0, 2) limitations.

FIG. 9 shows a diagram showing the status transition for generating the code satisfying the (d, k)=(0, 2) limitations. In FIG. 9, S0, S1 and S2 denote respective states and labels affixed between the respective states indicate bits output in case of status transition. For example, if the status transition that has occurred is "S0→S1→S2", an output bit string is "00". The bit string output in case status transition has occurred in accordance with the aforementioned status transition diagram necessarily satisfies the (d, k)=(0, 2) limitations.

Assume that the modulation encoding of outputting a 3 bit modulated code for a 2-bit input, with the code rate R=2/3. For generating the modulation code satisfying the (d, k)=(0, 2) limitations, it is apparently sufficient if status transition occurs thrice in accordance with the status transition diagram shown in FIG. 9, with the resulting output being a modulated code.

Figure 10:
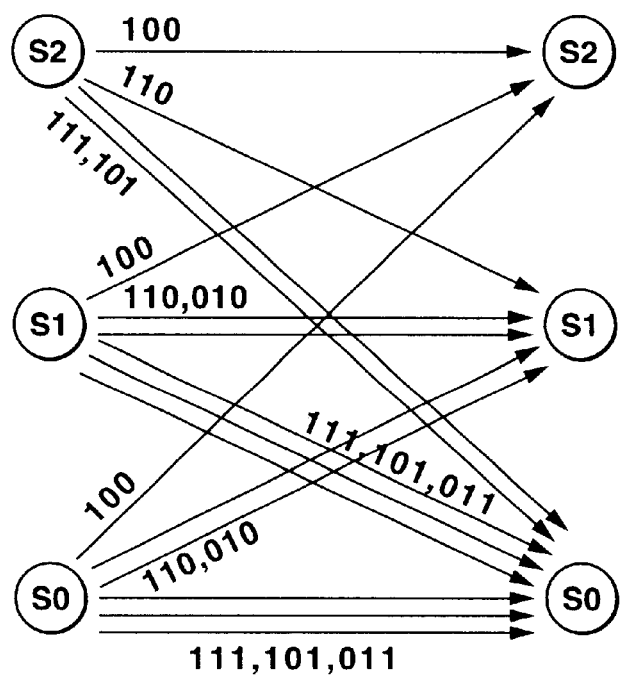
FIG. 10 illustrates the trellis when status transition has occurred thrice in accordance with the status transition diagram shown in FIG. 9.

The trellis when the status transition has occurred thrice in accordance with the status transition diagram shown in FIG. 9, that is, a diagram obtained on developing the status transition diagram along the time axis direction, is as shown in FIG. 10. For example, in the trellis shown in FIG. 10, a branch lying at an uppermost position indicates that there is one path starting at the status S2 and again getting to the status S2 after three status transitions, with a corresponding output being "100".

Figure 11:
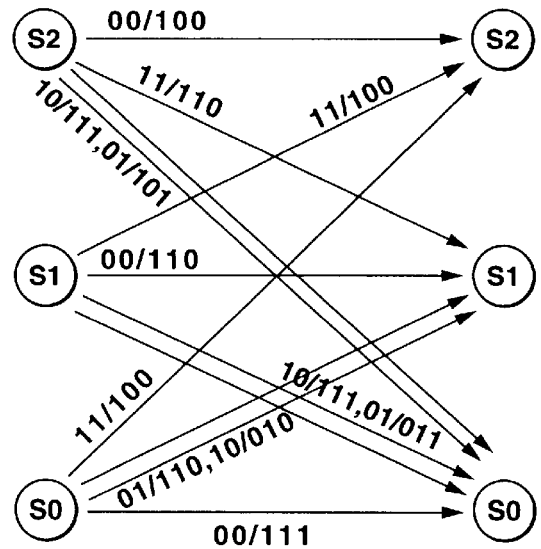
FIG. 11 illustrates the trellis constructed on branch selection from the trellis shown in FIG. 10.

In case of modulation encoding of outputting 3-bit modulated code for a 2-bit input, $2^2$=4 branches are selected from each state, these branches being then allocated to 2-bit inputs of "00, 01, 10, 11" to form a trellis in which an input is associated with an output. FIG. 11 shows a trellis formed on branch selection as described above. In FIG. 11, each label affixed between different states indicate an input/output. For example, in the trellis shown in FIG. 11, a branch S0→S2 indicates that, if "11" is input for the state S0, status transition occurs to the status S2, as "100" is output.

The encoder, applied to the magnetic recording and/or reproducing apparatus, shown as the second embodiment, repeats the status transition for encoding, in accordance with the trellis formed by the above-described sequence of operations, to generate a modulated code string having correlation between input data. The encoder may be provided with components shown for example in FIG. 12.

Figure 12:
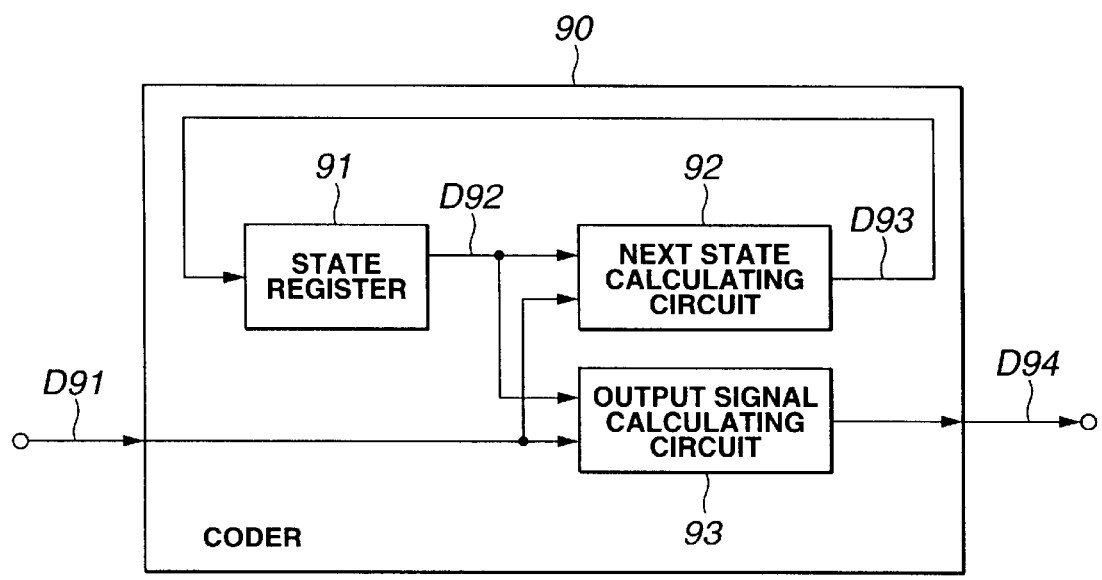
FIG. 12 is a block diagram showing the structure of an encoder used in a recording system of a magnetic recording and/or reproducing apparatus shown as a second embodiment of the present invention.

The encoder 90, shown in FIG. 12, includes a state register 91 for holding the state of the encoder 90, a next-state calculating circuit 92, for calculating the next transition state, and an output signal calculating circuit 93 for calculating an output signal D94.

The state register 91 is a 2-bit register holding 2 bits specifying the state of the current encoder 90. The state register 91 sends a status signal D92, specifying the 2 bits indicating the current state, to the next-state calculating circuit 92 and to the output signal calculating circuit 93, as the state register 91 holds 2 bits indicating the next state corresponding to the next state signal D93 supplied from the next-state calculating circuit 92.

When fed with the input signal D91 and with the status signal D92, supplied from the state register 91, the next-state calculating circuit 92 calculates the next state in accordance with the following input/output correlating table 4:

TABLE 4

Typical Input/Output Correlating Table

| status signals | input signals | next-state signals |
|---|---|---|
| 0 | 00 | 0 |
| 0 | 01 | 1 |
| 0 | 10 | 1 |
| 0 | 11 | 2 |
| 1 | 00 | 1 |
| 1 | 01 | 0 |
| 1 | 10 | 0 |
| 1 | 11 | 2 |
| 2 | 00 | 2 |
| 2 | 01 | 0 |
| 2 | 10 | 0 |
| 2 | 11 | 1 |
| 3 | 00 | 0 |
| 3 | 01 | 0 |
| 3 | 10 | 0 |
| 3 | 11 | 0 |

The next-state calculating circuit 92 sends a next state signal D93, indicating the next state, to the state register 91.

If fed with the input signal D91 and with the status signal D92, supplied from the state register 91, the output signal calculating circuit 93 calculates an output signal D94, in accordance with the following input/output correlating table 5:

TABLE 5

Typical Input/Output Correlating Table

| status signals | input signals | output signals |
|---|---|---|
| 0 | 00 | 111 |
| 0 | 01 | 110 |
| 0 | 10 | 010 |
| 0 | 11 | 100 |
| 1 | 00 | 110 |
| 1 | 01 | 011 |
| 1 | 10 | 111 |
| 1 | 11 | 100 |
| 2 | 00 | 100 |
| 2 | 01 | 101 |
| 2 | 10 | 111 |
| 2 | 11 | 110 |
| 3 | 00 | 111 |
| 3 | 01 | 111 |
| 3 | 10 | 111 |
| 3 | 11 | 111 |

Meanwhile, this output signal D94 meets the (d, k)=(0, 2) limitations.

When fed with the input signal D91, the encoder 90 calculates the next state, using this input signal D91 and the status signal D92, by the next-state calculating circuit 93, for storage sequentially in the state register 91. The encoder 90 calculates an output signal D94, by the output signal calculating circuit 93, using the input signal D91 and the status signal D92, by the output signal calculating circuit 93, to output the so-calculated output signal D94.

Since there lacks the status S3 in the encoder 90, if transition to the status S3 occurs before the resetting of the encoder 90, an output signal "111" is instantly output as an output signal D94, based on the Table 5, to realize the function of resetting to the state S0.

A decoder for decoding the signal, encoded by the above-described encoder, applies the decoding, which is based on the BCJR or SOVA algorithm, in accordance with the trellis previously explained with reference to FIG. 11. With this decoder, the magnetic recording and/or reproducing apparatus is able to perform trellis decoding exploiting the signal correlation in the modulation encoder.

In particular, if, in performing trellis decoding in the magnetic recording and/or reproducing apparatus, SISO decoding of the BCJR or SOVA algorithm is used in the decoder, the soft information can be output to the error correction decoding circuit provided downstream of the modulation decoder, thereby improving the decoding error rate.

The magnetic recording and/or reproducing apparatus, employing this type of the encoder and the decoder, is hereinafter explained with reference to FIG. 13.

Figure 13:
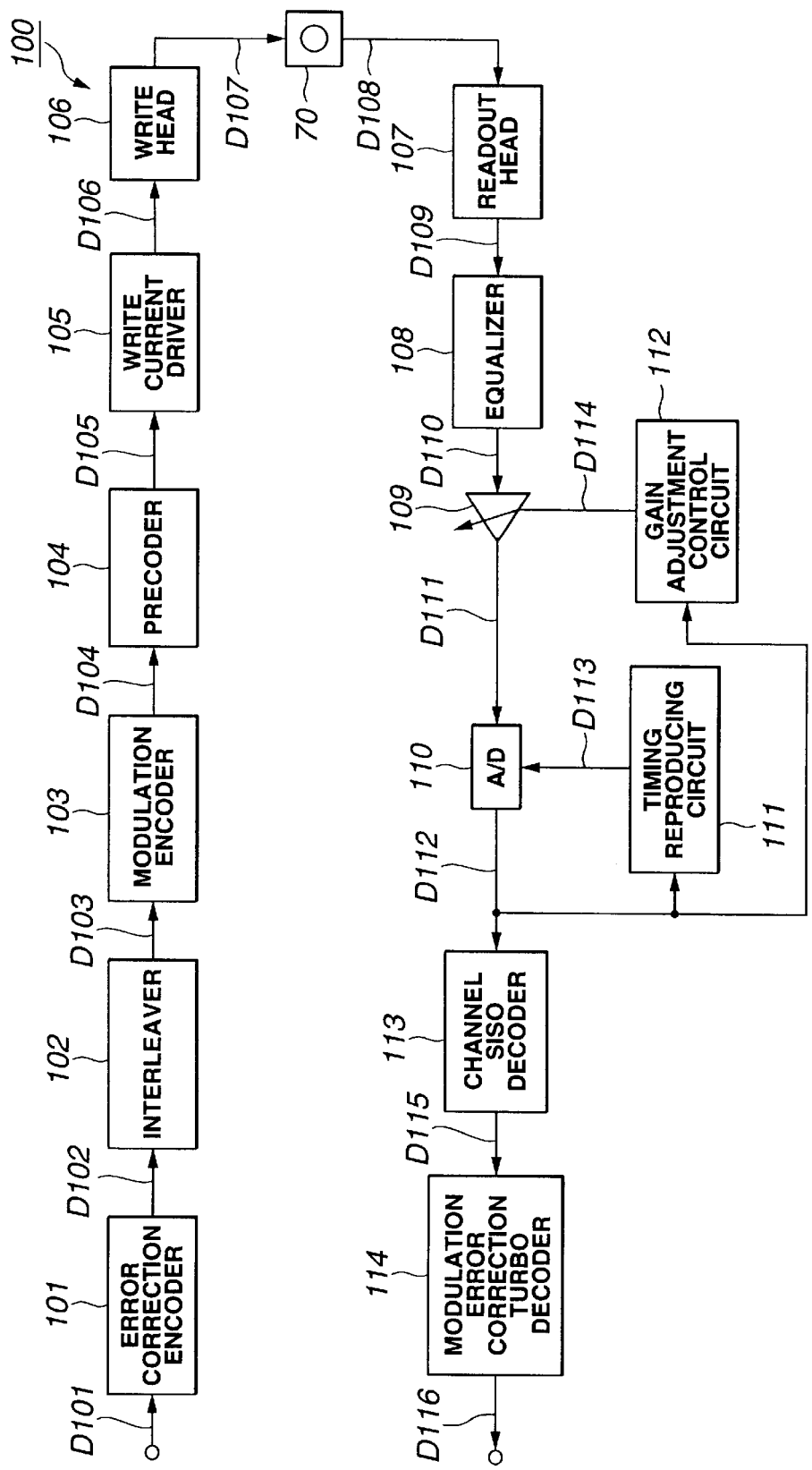
FIG. 13 is a block diagram for illustrating the structure of the magnetic recording and/or reproducing apparatus.

The magnetic recording and/or reproducing apparatus 100, shown in FIG. 13, includes, as a recording system for recording data on a recording medium 70, an error correction encoder 101 for error correction encoding input data, an interleaver 102 for re-arraying the sequence of the input data, a modulation encoder 103 for modulation-encoding the input data, a precoder 104 for filtering input data for compensating its channel characteristics, a write current driver 105 for converting respective bits of the input data into write current values, and a write head 106 for recording data on the recording medium 70.

Similarly to the error correction coder 51 in the magnetic recording and/or reproducing apparatus 50, the error correction encoder 101, as error correcting encoding means, error correction encodes the input data D101. The error correction encoder 101 sends the error correction encoded data D102 to the downstream side interleaver 102.

Similarly to the interleaver 52 of the magnetic recording and/or reproducing apparatus 50, the interleaver 102, as (first) interleaving means, interleaves the error correction encoded data D102 supplied from the error correction encoder 101 to re-array the respective bits making up the error correction encoded data D102. The interleaver 102 routes the so-generated interleaved data D103 to the downstream side modulation encoder 103.

The modulation encoder 103, as modulation encoding means, is configured as the aforementioned encoder 90, and is a modulation encoder which repeatedly performs the state transitions in accordance with the trellis to generate a modulated codestring exhibiting correlation between input data. The modulation encoder 103 applies pre-set trellis modulation encoding to the interleaved data D 103 supplied from the interleaver 102 to generate modulation encoded data D 104 as a sequence subjected to limitations. The modulation encoder 103 sends the so-generated modulation encoded data D104 to the downstream side precoder 104.

Similarly to the precoder 54 of the aforementioned magnetic recording and/or reproducing apparatus 50, the precoder 104 filters the modulation encoded data D104, supplied from the interleaver 103, in such a manner as to compensate for channel characteristics from the data writing to the recording medium 70 to the output in the equalizer 108 in the reproducing system, thereby generating a precode signal D105 as a binary signal. The precoder 104 sends the so-generated precode signal D105 to the downstream side write current driver 105.

Similarly to the write current driver 55 in the aforementioned magnetic recording and/or reproducing apparatus 50, the write current driver 105 converts respective bits of the precode signal D105, supplied from the precoder 104, into the write current value $I_S$, to generate a write current signal D 106. The write current driver 105 sends the generated write current signal D106 to a downstream side write head 106.

Similarly to the write head 56 in the aforementioned magnetic recording and/or reproducing apparatus 50, the write head 106 applies a magnetic write signal D107, corresponding to the write current signal D106 supplied from the write current driver 105, to the recording medium 70, to record data thereon.

In recording data on the recording medium 70, the recording system in the magnetic recording and/or reproducing apparatus 100 error correction encodes the input data D101 by the error correction encoder 101. The recording system then interleaves the error correction encoded data D102 by the interleaver 102 and applies pre-set trellis modulation encoding to the interleaved data D103 to generate the precode signal D105 by the precoder 104.

The recording system records the precode signal D105, generated by the precoder 104, on the recording medium 70, by the write current driver 105 and the write head 106.

The recording system of the magnetic recording and/or reproducing apparatus 100, thus having the interleaver 102 downstream of the error correction encoder 101, effects encoding by serial concatenated coding between the error correction encoder 101 and the modulation encoder 103 to realize high performance encoding as the error correction coding and modulation encoding.

As the reproducing system for reproducing data recorded on the recording medium 70, the magnetic recording and/or reproducing apparatus 100 includes a readout head 107 for reading out data recorded on the recording medium 70, an equalizer 108 for equalizing input data, a gain adjustment circuit 109 for adjusting the gain of the input data, an A/D circuit 110 for converting analog data to digital data, a timing circuit 111 for reproducing clocks, a gain adjustment control circuit 112 for controlling the gain adjustment circuit 109, a channel SISO decoder 113, as an SISO decoder, for decoding the channel response from a pre-stage of the precoder 104 in the recording system to an output in the equalizer108 in the reproducing system, and an error correction turbo decoder 114 for turbo-decoding the input data.

Similarly to the readout head 57 of the magnetic recording and/or reproducing apparatus 50, the readout head 107 reads out the readout magnetic signal D108 from the recording medium 70 to generate a readout current signal D109 conforming to the readout magnetic signal D108. The readout head 107 sends the so-generated current signal D109 to the downstream side equalizer 108.

Similarly to the equalizer 58 of the magnetic recording and/or reproducing apparatus 50, the equalizer 108 equalizes the readout current signal D109, supplied from the readout head 107, so that the channel response from the data writing on the recording medium 70 in the recording system up to the outputting at the equalizer 108 will be of pre-set characteristics, to generate an equalized signal D110. The equalizer 108 routes the generated equalized signal D110 to the downstream side gain adjustment circuit 109.

Similarly to the gain adjustment circuit 59 of the magnetic recording and/or reproducing apparatus 50, the gain adjustment circuit 109 adjusts the gain of the equalized signal D110, supplied from the equalizer 108, based on a gain adjustment control signal D114, supplied from the gain adjustment control circuit 112, to generate a gain adjustment signal D111. The gain adjustment circuit 109 routes the generated gain adjustment signal D111 to the downstream side A/D converter 110.

Similarly to the A/D converter 60 of the magnetic recording and/or reproducing apparatus 50, the A/D converter 110 samples and digitizes the gain adjustment signal D111, supplied from the gain adjustment circuit 109, based on the clock signal D113, supplied from the timing regenerating circuit 111, to generate a digital channel signal D112. The A/D converter 110 sends the generated digital channel signal D112 to the timing regenerating circuit 111, gain adjustment control circuit 112 and to the channel SISO decoder 113.

Similarly to the timing generating circuit 61 of the magnetic recording and/or reproducing apparatus 50, the timing regenerating circuit 111 regenerates clocks from the digital channel signal D112 supplied from the A/D converter 110 to generate clock signals D113. The timing regenerating circuit 111 sends the generated clock signals D113 to the A/D converter 110.

Similarly to the gain adjustment control circuit 62 of the magnetic recording and/or reproducing apparatus 50, the gain adjustment control circuit 112 generates, based on the digital channel signal D112, supplied from the A/D converter 110, a gain adjustment control signal D114, which is a control signal used for maintaining the amplitude of the equalized signal D110 at an expected value. The gain adjustment control circuit 112 sends the generated gain adjustment control signal D114 to the gain adjustment circuit 109.

Similarly to the channel SISO decoder 63 of the magnetic recording and/or reproducing apparatus 50, the channel SISO decoder 113 is fed with the digital channel signal D112, supplied from the A/D converter 110, and effects soft output decoding, based on the trellis corresponding to the channel response from a pre-stage of the precoder 104 in the recording system to an output in the equalizer 108 in the recording system, in accordance with the aforementioned BCJR algorithm or SOVA, to generate a channel soft output signal D115. The channel SISO decoder 113 sends the so-generated channel soft output signal D115 to the downstream modulation and error correction turbo decoder 114. Meanwhile, the channel SISO decoder 113 may be of any suitable structure if it is designed as a SISO decoder.

Similarly to the modulation and error correction turbo decoder 64 in the aforementioned magnetic recording and/or reproducing apparatus 50, the modulation and error correction turbo decoder 114 effects turbo decoding by concatenating the SISO decoders. The modulation and error correction turbo decoder 114 is fed with the channel soft output signal D115, supplied from the channel SISO decoder 113 to effect turbo decoding, to output the decoded result as the soft or hard output data D116 to outside, as will be explained in detail subsequently.

Figure 14:
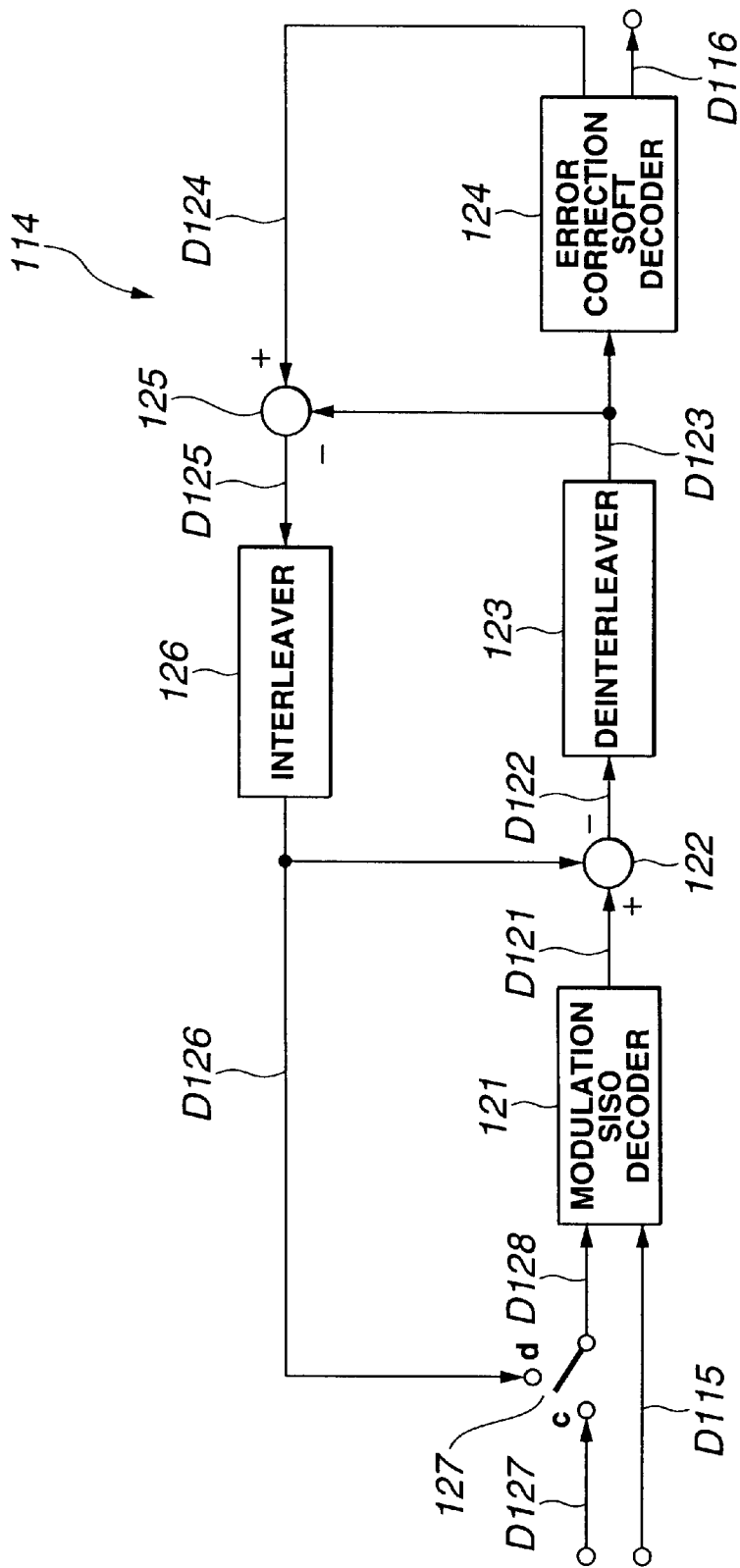
FIG. 14 is a block diagram for illustrating the structure of the modulation and error correction turbo decoder provided in a reproducing system of the magnetic recording and/or reproducing apparatus.

Referring to FIG. 14, the modulation and error correction turbo decoder 114 is explained in detail.

In this figure, the modulation and error correction turbo decoder 114 includes a modulation SISO decoder 121, as an SISO decoder for modulation decoding the input data, a deinterleaver 123, for restoring the input data sequence to its original sequence, an error correction soft decoder 124 for error correcting and soft decoding the input data, an interleaver 126 for re-arraying the input data in its sequence, a changeover switch 127 for switching between data input as the priori probability information for an information bit, and two difference taking units 122, 125.

The modulation SISO decoder 121, as modulation decoding means, decodes the signals, encoded by the modulation encoder 103 in the recording system, and is a SISO type modulation decoder. The modulation SISO decoder 121 is fed with a channel soft output signal D115, as soft input fed from the channel SISO decoder 113, and with the priori probability information D128, as selected by the changeover switch 127 from the priori probability information D126 for an information bit, as soft input supplied from the interleaver 126, or the priori probability information D127 for an information bit with a value equal to "0", and effects soft output decoding, based on the aforementioned BCJR algorithm or the SOVA, in accordance with the trellis corresponding to the constraint condition. If the interleaved data D103 prior to modulation encoding by the modulation encoder 103 in the recording system is expressed as M(t) ($0 \leq t \leq N$), the modulation SISO decoder 121 calculates the log posterior probability ratio for M(t) log P(M(t)=1)/P(M(t)=0)), to route this log posterior probability ratio as the modulation decoded signal D121 to the difference taking unit 122.

The difference taking unit 122 finds a difference between the modulation decoded signal D121, as soft input, supplied from the modulation 1 SISO decoder 121, and the priori probability information D126, as soft input, supplied from the interleaver 126, to output data corresponding to this difference value as soft output to the downstream side deinterleaver 123 as the modulation extrinsic information signals D122 for an information bit as found by the code constraint condition. Meanwhile, the modulation extrinsic information signals D122 corresponds to the interleaved data D103 obtained on interleaving by the interleaver 102 in the recording system.

The deinterleaver 123, as deinterleaving means, deinterleaves the modulation exterior information signals D122 from the difference taking unit 122 in order to restore the bit sequence to that of the original interleaved data D103 obtained by the interleaver 102 of the recording system. The deinterleaver 123 sends the deinterleaved data to the error correction soft decoder 124 and to the difference taking unit 125 as the deinterleaved signal D123 which is the priori probability information for the code bits in the error correction soft decoder 124.

The error correction soft decoder 124, as error correction decoding means, effects soft decoding of error correction codes of the deinterleaved signal D123 supplied from the deinterleaver 123, based on the aforementioned BCJR algorithm or the SOVA. If the error correction encoded data D102 following error correction coding by the error correction encoder 101 in the recording system is expressed as E(t) ($0 \leq t \leq N$), and the input data D101 prior to error code coding by the error correction encoder 101 is expressed as I(t) ($0 \leq t \leq K$), the error correction soft decoder 124 calculates the log posterior probability ratio log (P(E(t)=1)/P(E(t)=0)) for E(t) to route the log posterior probability ratio as the modulation error correction decoded signal D124 to the difference taking unit 125, while calculating the log posterior probability ratio log (P(I(t)=1)/P(I(t)=0)) as the posterior probability information for I(t) to send the decoded result based on this log posterior probability ratio as soft or hard output data D116 to outside.

The difference taking unit 125 finds a difference between the modulation error correction decoded signal D124, supplied as soft input from the error correction soft decoder 124, and the deinterleaved signal D123, supplied as soft input from the deinterleaver 123, to output the data as the difference value as soft output to the downstream side interleaver 126 as the error correction extrinsic information signals D125, which is the extrinsic information for a code bit as found by the code constraint condition.

The interleaver 126, as second interleaving means, interleaves the error correction extrinsic information signals D125, supplied from the difference taking unit 125, based on the same interleaving position information as that of the interleaver 102 of the recording system. The interleaver 126 sends the interleaved data to the modulation SISO decoder 121 and to the difference taking unit 122 as being the priori probability information signal D126 for the information bit in the modulation SISO decoder 121.

In the initial stage of the decoding, the changeover switch 127 is set to the fixed terminal c supplying a value 0 corresponding to the priori probability information signal D127 to select the priori probability information signal D127 as being the priori probability information signal D128 for an information bit in the modulation SISO decoder 121. The changeover switch 127 then is set to a fixed terminal d supplying the priori probability information signal D126 supplied from the interleaver 126 to select the priori probability information signal D126 as being the priori probability information signal D128.

Similarly to the modulation and error correction turbo decoder 64 in the previously described magnetic recording and/or reproducing apparatus, the modulation and error correction turbo decoder 114 is provided with the error correction soft decoder 124 and the modulation SISO decoder 121, as counterparts to the error correction coder 101 and the modulation encoder 103 of the recording system, respectively, as described above, to decompose the code of high decoding complexity into elements with lower decoding complexity, such as to sequentially improve characteristics by the interaction between the modulation SISO decoder 121 and the error correction soft decoder 124. If fed with the channel soft output signal D115, as a soft input, from the channel SISO decoder 113, the modulation and error correction turbo decoder 114 iterates the decoding operations from the modulation SISO decoder 121 to the error correction soft decoder 124 a pre-set number of times, such as several to tens of times, to output the soft-output log posterior probability ratio, obtained on decoding the pre-set number of times, directly to outside, or to output hard output data D116, after binary-coding by a binary coding circuit, not shown.

In reproducing data recorded on the recording medium 70, the reproducing system of the magnetic recording and/or reproducing apparatus 100 soft-output decodes the soft-input digital channel signal D112, generated through the readout head 107, equalizer 108, gain adjustment circuit 109 and the A/D converter 110, by the channel SISO decoder 113, to generate the channel soft output signal D115 corresponding to the modulation encoded data D103 input to the modulation precoder 104 in the recording system.

This reproducing system turbo-decodes the channel soft output signal D115, generated by the channel SISO decoder 113, by the modulation and error correction turbo decoder 114, to output the resulting soft output data directly to outside as output data D116, or binary codes the soft output data to generate hard output data D116 which is issued to outside.

The reproducing system of the magnetic recording and/or reproducing apparatus 100 is provided in this manner with the modulation and error correcting turbo decoder 114 and performs turbo decoding between the error correction soft decoder 124 and the modulation SISO decoder 121 as counterpart devices of the error correction encoder 101 and the modulation encoder 103 of the recording system, respectively, to realize decoding in meeting with the modulation encoding and error correction encoding.

The magnetic recording and/or reproducing apparatus 100 includes, in its recording system, the interleaver 102 downstream of the error correction encoder 101, to effect encoding by serial concatenated code between the error correction encoder 101 and the modulation encoder 103, while including, on its reproducing side, the modulation and error correction turbo decoder 114 to effect turbo decoding to realize high performance coding as well as highly efficient turbo decoding exploiting the soft information for the entire decoding processing for the code. Since there is no necessity of diminishing the information, the decoding error rate can be lowered significantly. Moreover, the magnetic recording and/or reproducing apparatus 100 effects coding in the recording system, as correlation is afforded to the fore and aft side data. In addition, trellis decoding can be performed on the reproducing side in meeting with the constraint condition, thus further lowering the decoding error rate.

The above-described magnetic recording and/or reproducing apparatus 50, 100 are able to perform efficient encoding by exploiting the soft information, thereby lowering the decoding error rate. In particular, with the magnetic recording and/or reproducing apparatus 100, encoding can be made as correlation is afforded to the fore and aft side data, without doing block-based encoding or decoding, while trellis decoding can be made in meeting with the constraint conditions, thus further lowering the decoding error rate. That is, the magnetic recording and/or reproducing apparatus 50, 100 is able to realize high precision decoding, thus assuring high operational reliability fort the user.

The present invention is not limited to the above-described embodiment. For example, the present invention may be applied to a recording medium 70 other than the recording medium of the magnetic recording system, that is to a recording medium by the optical recording system, such as a so-called CD (Compact Disc) or to the DVD (Digital Versatile Disc) or to a recording medium of the photomagnetic recording system, such as a so-called magneto-optical disc (MO) disc.

In the above-described embodiment, it is assumed that the magnetic recording and/or reproducing apparatus 100 performs trellis modulation encoding on the encoder side and trellis modulation decoding on the decoder side. However, the present invention is applicable to such a case wherein the trellis modulation decoding is performed on the decoder side to output a soft decision value even in case block modulation is effected in place of trellis modulation encoding on the encoder side Moreover, in the above-described embodiment, it is assumed that the magnetic recording and/or reproducing apparatus 50 or 100 is a unitary apparatus provided with the recording and reproducing systems. Alternatively, a unitary recording apparatus may be configured as a recording system for recording data on a recording medium, while a unitary reproducing apparatus may also be configured as a reproducing system for reproducing the data recorded on the recording apparatus.

In the foregoing, the present invention has been disclosed only by way of illustration and should not be interpreted in a limiting fashion. The scope of the present invention is to be interpreted in light of the description of the following claims.

What is claimed is:

1. A data reproducing apparatus for reproducing data recorded by a recording equipment for recording data on a recording medium, the recording equipment including error correction encoding means for applying error correction coding to input data, first interleaving means for interleaving data supplied from said error correction encoding means for re-arraying the data sequence, and modulation encoding means for performing predetermined modulation encoding on data supplied from said interleaving means; whereby serial concatenated coding is executed between the error correction encoding means and the modulation encoding means, said apparatus comprising:

deinterleaving means for interleaving the input data in its sequence for restoring the bit sequence of data re-arrayed by said first interleaving means to a bit sequence of data encoded by said error correction encoding means;

error correction decoding means for decoding the error correction codes of data supplied from said deinterleaving means; and second interleaving means for interleaving the sequence of data for interleaving and re-arraying the sequence of data given by a difference between data output from said error correction decoding means and data output from said deinterleaving means based on the same interleaving position information as that of said first interleaving means.

2. The data reproducing apparatus according to claim 1 wherein said error correction decoding means is fed with a soft input signal.

3. The data reproducing apparatus according to claim 2 wherein said error correction decoding means soft-decodes the error correction code of the soft input signal.

4. The data reproducing apparatus according to claim 1 wherein the apparatus further comprises modulation decoding means for modulation decoding input data.

5. The data reproducing apparatus according to claim 4 wherein said modulation decoding means is fed with a soft input signal and outputs a soft output signal.

6. The data reproducing apparatus according to claim 5 wherein said deinterleaving means interleaves the sequence of data given by a difference between data output by said modulation decoding means and data output by said second interleaving means;

decoding being made iteratively between said error correcting decoding mean and the modulation decoding means.

7. The data reproducing apparatus according to claim 5 wherein said modulation decoding means performs soft output decoding based on the BCJR algorithm or SOVA algorithm.

8. The data reproducing apparatus according to claim 4 wherein said modulation encoding means encodes data supplied from said first interleaving means in accordance with a constraint condition, and wherein said modulation decoding means performs decoding corresponding to said constraint condition.

9. The data reproducing apparatus according to claim 8 wherein said modulation encoding means encodes data supplied from said first interleaving means in accordance with block modulation.

10. The data reproducing apparatus according to claim 9 wherein said modulation decoding means includes:
   likelihood calculating means for calculating a likelihood value corresponding to each codeword output from said modulation encoding means,
   wherein the posterior probability information as a soft decision value for an input bit to said modulation encoding means and an output bit from said modulation encoding means is found using the likelihood value as calculated by said likelihood calculating means.

11. The data reproducing apparatus according to claim 9 wherein said modulation decoding means performs decoding based on a trellis corresponding to said constraint condition.

12. The data reproducing apparatus according to claim 8 wherein said modulation encoding means encodes data supplied from said first interleaving means in accordance with a trellis corresponding to said constraint condition, and
   wherein said modulation decoding means performs decoding based on a trellis corresponding to said constraint condition.

13. The data reproducing apparatus according to claim 1 wherein said recording equipment includes precoding means for performing filtering for compensating for channel characteristics for data supplied from said modulation encoding means, the appratus further comprising:
   channel decoding means for decoding the channel response.

14. The data reproducing apparatus according to claim 13 wherein said channel decoding means is fed with a soft input signal and performs soft output decoding.

15. The data reproducing apparatus according to claim 13 wherein said channel decoding means is fed with a soft input signal and performs soft output decoding based on the trellis corresponding to channel response.

16. The data reproducing apparatus according to claim 1 wherein said recording medium has data recorded thereon in a magnetic, an optical or a magneto-optical system.

17. A data reproducing method for reproducing data recorded by a recording method for recording data on a recording medium, the recording method including an error correction encoding step of applying error correction cording to input data, first interleaving step of interleaving data supplied from said error correction encoding step for re-arraying the data sequence, a step of performing modulation encoding on the interleaved data, and step of executing serial concatenated coding between the steps of applying error correction coding and performing modulation encoding, said data reproducing method comprising the steps of:
   deinterleaving the input data in its sequence for restoring the bit sequence of data re-arrayed by said first interleaving step to a bit sequence of data encoded by said error correction encoding step;
   decoding the error correction codes of data supplied from said step of deinterleaving; and
   interleaving the sequence of data for re-arraying the sequence of data given by a difference between data decoded in said step of decoding and data output from said step of deinterleaving based on the same interleaving position information as that of said first interleaving step.

18. The data reproducing method according to claim 17 wherein said step of decoding is fed with a soft input signal.

19. The data reproducing method according to claim 18 wherein said step of decoding soft-decodes the error correction code of the soft input signal.

20. The data reproducing method according to claim 17 wherein said data reproducing method further comprises modulation decoding input data.

21. The data reproducing method according to claim 20 wherein said step of modulation decoding is fed with a soft input signal and outputs a soft output signal.

22. The data reproducing method according to claim 21 wherein said step of deinterleaving interleaves the sequence of data given by a difference between data decoded in said step of modulation decoding and data re-arrayed in said step of interleaving;
   decoding being made iteratively between said step of decoding and the step of modulation decoding.

23. The data reproducing method according to claim 17 wherein said recording method includes a precoding step of performing filtering for compensating for channel characteristics for data supplied from said modulation encoding step, the date reproducing method further comprising:
   decoding the channel response.

24. The data reproducing method according to claim 20 wherein said step of modulation encoding encodes data supplied from said first interleaving step in accordance with a constraint condition, and
   wherein said step of modulation decoding performs decoding corresponding to said constraint condition.

25. The data reproducing method according to claim 24 wherein said modulation encoding step encodes data supplied from said first interleaving step in accordance with block modulation.

26. The data reproducing method according to claim 25 wherein said step of modulation decoding includes:
   a likelihood calculating step of calculating a likelihood value corresponding to each codeword generated in and output from said modulation encoding step;
   wherein the posterior probability information as a soft decision value for an input bit to said modulation encoding step and an output bit generated in and issued from said modulation encoding step is found using the likelihood value as calculated by said likelihood calculating step.

27. The data reproducing method according to claim 25 wherein said step of modulation decoding performs decoding based on a trellis corresponding to said constraint condition.

28. The data reproducing method according to claim 24 wherein said step of modulation encoding encodes data supplied from said first interleaving step in accordance with a trellis corresponding to said constraint condition, and
   wherein said step of modulation decoding performs decoding based on a trellis corresponding to said constraint condition.

29. The data reproducing method according to claim 21 wherein said step of modulation decoding performs soft output decoding based on the BCJR algorithm or SOVA algorithm.

30. The data reproducing method according to claim 23 wherein said step of decoding the channel response is fed with a soft input signal and performs soft output decoding.

31. The data reproducing method according to claim 23 wherein said step of decoding channel response is fed with a soft input signal and performs soft output decoding based on the trellis corresponding to channel response.

32. The data reproducing method according to claim 17 wherein said recording medium has data recorded thereon in a magnetic, an optical or a magneto-optical system.

33. A data recording and reproducing apparatus for recording and reproducing data on or from a recording medium, comprising:

error correction encoding means for applying error correction encoding to input data;

first interleaving means for interleaving data supplied from said error correction encoding means for re-arraying the data sequence;

modulation encoding means for performing predetermined modulation encoding on data supplied from said first interleaving means;

whereby serial concatenated coding is executed between the error correction encoding means and the modulation encoding means;

deinterleaving means for interleaving reproduced data in its sequence for restoring the bit sequence of data re-arrayed by said first interleaving means to a bit sequence of data encoded by said error correction encoding means;

error correction decoding means for decoding the error correction codes of data supplied from said deinterleaving means; and second interleaving means for interleaving the sequence of data given by a difference between data output from said error correction decoding means and data output from said deinterleaving means based on the same interleaving position information as that of said first interleaving means.

34. The data recording and reproducing apparatus according to claim 33 wherein said error correction decoding means is fed with a soft input signal.

35. The data recording and reproducing apparatus according to claim 34 wherein said error correction decoding means performs soft decoding of a soft input signal.

36. The data recording and reproducing apparatus according to claim 33, further comprising:

modulation decoding means for modulation decoding input data.

37. The data recording and reproducing apparatus according to claim 36 wherein said modulation encoding means encodes data supplied from said first interleaving means in accordance with a constraint condition;

said modulation decoding means effects decoding in meeting with said constraint condition.

38. The data recording and reproducing apparatus according to claim 37 wherein said modulation encoding means encodes data supplied from said first interleaving means by block modulation.

39. The data recording and reproducing apparatus according to claim 38 wherein said modulation decoding means has likelihood calculating means for calculating the likelihood value corresponding to each codeword output from said modulation encoding means, and wherein the posterior probability information as a decision value for an input bit to said modulation encoding means and an output bit from said modulation encoding means being found using the likelihood value as calculated by said likelihood calculating means.

40. The data recording and reproducing apparatus according to claim 38 wherein said modulation decoding means performs decoding based on the trellis in meeting with said constraint condition.

41. The data recording and reproducing apparatus according to claim 37 wherein said modulation encoding means encodes data supplied from said first interleaving means in accordance with a trellis conforming to said constraint condition, and wherein said modulation decoding means performs decoding based on the trellis conforming to said constraint condition.

42. The data recording and reproducing apparatus according to claim 36 wherein said modulation decoding means is fed with a soft input signal and outputs a soft output signal.

43. The data recording and reproducing apparatus according to claim 42 wherein said deinterleaving means interleaves and re-arrays the sequence of data given as a difference between data output from said modulation decoding means and data output from said second interleaving means;

decoding being made iteratively between said error correction decoding means and the modulation decoding means.

44. The data recording and reproducing apparatus according to claim 42 wherein said modulation decoding means performs soft output decoding based on the BCJR algorithm or on the SOVA algorithm.

45. The data recording and reproducing apparatus according to claim 33, further comprising:

precoding means for performing filtering for compensating for channel characteristics for data supplied from said modulation encoding means; and channel decoding means for decoding the channel response.

46. The data recording and reproducing apparatus according to claim 45 wherein said channel decoding means is fed with a soft input signal and performs soft output decoding.

47. The data recording and reproducing apparatus according to claim 45 wherein said channel decoding means is fed with a soft input signal and performs soft output decoding based on a trellis conforming to the channel response.

48. The data recording and reproducing apparatus according to claim 33 wherein said recording medium has data recorded thereon in a magnetic, an optical or a magneto-optical system.

49. A data recording and reproducing method for recording and/or reproducing data on or from a recording medium, comprising the steps of:

applying error correction encoding to input data;

interleaving the error correction encoded data supplied from said step of applying for re-arraying the data sequence;

performing modulation encoding on the interleaved data;

executing serial concatenated coding between the steps of applying error correction coding and performing modulation encoding;

deinterleaving reproduced data in its sequence for restoring the bit sequence of data re-arrayed by said step of interleaving to a bit sequence of data encoded by said step of applying;

decoding the error correction codes of data supplied from said step of deinterleaving; and interleaving the sequence of data given by a difference between data output from said step of decoding and data output from said step of deinterleaving based on the same interleaving position information as that of said step of interleaving the error correction encoded date.

50. The data recording and reproducing method according to claim 49 wherein said step of decoding is fed with a soft input signal.

51. The data recording and reproducing method according to claim 50 wherein said step of decoding soft-decodes a soft input signal.

52. The data recording and reproducing method according to claim 49, further comprising:

modulation decoding input data.

53. The data recording and reproducing method according to claim 52 wherein said step of modulation decoding step is fed with a soft input signal and outputs a soft output signal.

54. The data recording and reproducing method according to claim 53 wherein said step of deinterleaving interleaves and re-arrays the sequence of data given as a difference between data decoded in said step of modulation decoding and data re-arrayed in said step of interleaving the sequence of data;

decoding being made iteratively between said step of decoding and said step of modulation decoding.

55. The data recording and reproducing method according to claim 53 wherein said step of modulation decoding performs soft output decoding based on the BCJR algorithm or on the SOVA algorithm.

56. The data recording and reproducing method according to claim 52 wherein said step of modulation encoding encodes data re-arrayed in said step of interleaving the error correction encoded data in accordance with a constraint condition;

said step of modulation decoding effects performing decoding in meeting with said constraint condition.

57. The data recording and reproducing method according to claim 56 wherein said step of modulation encoding encodes data supplied from said step of interleaving the error correction encoded data by block modulation.

58. The data recording and reproducing method according to claim 57 wherein said step of modulation decoding has a likelihood calculating step of calculating the likelihood value corresponding to each codeword generated in and output from said step of modulation encoding; and wherein the posterior probability information as a decision value for an input bit to said step of modulation encoding and an output bit generated in and issued from said step of modulation encoding being found using the likelihood value as calculated by said likelihood calculating step.

59. The data recording and reproducing method according to claim 57 wherein said step of modulation decoding performs decoding based on the trellis in meeting with said constraint condition.

60. The data recording and reproducing method according to claim 56 wherein said step of modulation encoding encodes data supplied from said step of interleaving the error correction encoded data in accordance with a trellis conforming to said constraint condition, and wherein said step of modulation decoding performs decoding based on the trellis conforming to said constraint condition.

61. The data recording and reproducing method according to claim 49, further comprising:

performing filtering for compensating for channel characteristics for data supplied from said step of modulation encoding; and decoding the channel response.

62. The data recording and reproducing method according to claim 61 wherein said step of decoding the channel response is fed with a soft input signal and performs soft output decoding.

63. The data recording and reproducing method according to claim 61 wherein said step of decoding the channel response is fed with a soft input signal and performs soft output decoding based on a trellis conforming to the channel response.

64. The data recording and reproducing method according to claim 49 wherein said recording medium has data recorded thereon in a magnetic, an optical or a magneto-optical system.

* * * * *